(12) United States Patent
Huang

(10) Patent No.: US 11,830,919 B2
(45) Date of Patent: Nov. 28, 2023

(54) SEMICONDUCTOR DEVICE AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 92 days.

(21) Appl. No.: 17/508,800

(22) Filed: Oct. 22, 2021

(65) Prior Publication Data

US 2022/0045187 A1 Feb. 10, 2022

Related U.S. Application Data

(62) Division of application No. 16/678,231, filed on Nov. 8, 2019, now Pat. No. 11,502,181.

(51) Int. Cl.
*H01L 21/8234* (2006.01)
*H01L 29/423* (2006.01)
(Continued)

(52) U.S. Cl.
CPC .......... *H01L 29/42372* (2013.01); *H01L 21/823412* (2013.01); *H01L 21/823418* (2013.01); *H01L 21/823456* (2013.01); *H01L 29/1037* (2013.01); *H01L 29/4236* (2013.01); *H01L 29/66484* (2013.01); *H01L 29/66757* (2013.01); *H01L 29/66787* (2013.01); *H01L 29/78* (2013.01); *H01L 29/78696* (2013.01); *H10B 12/053* (2023.02); *H10B 12/09* (2023.02);
(Continued)

(58) Field of Classification Search
CPC ............... H10B 12/09; H10B 12/488; H10B 41/42–49; H01L 27/10891; H01L 27/11531–11546; H01L 27/10894; H01L 21/823412; H01L 21/823456; H01L 29/1037; H01L 29/66787; H01L 29/4236; H01L 29/66621; H01L 29/7834; H01L 29/78696
See application file for complete search history.

(56) References Cited

U.S. PATENT DOCUMENTS 8,268,694 B2 * 9/2012 Jung ................ H01L 29/66575
438/303
9,472,664 B1 * 10/2016 Wu ...................... H01L 29/1041
(Continued)

FOREIGN PATENT DOCUMENTS

CN 108878434 A * 11/2018
JP 2011129565 A * 6/2011 ..... H01L 21/823412
(Continued)

OTHER PUBLICATIONS

Office Action dated Mar. 22, 2022 related to U.S. Appl. No. 16/678,231, wherein this application is a DIV of U.S. Appl. No. 16/678,231.

*Primary Examiner* — Yu Chen
(74) *Attorney, Agent, or Firm* — Xuan Zhang

(57) ABSTRACT

The present application discloses a method for fabricating a semiconductor device with a flat surface. The method for fabricating a semiconductor device including providing a substrate, forming a gate structure on the substrate, and forming a plurality of word lines having top surfaces at a same vertical level as a top surface of the gate structure.

5 Claims, 30 Drawing Sheets

(51) Int. Cl.
  *H01L 29/66* (2006.01)
  *H01L 29/78* (2006.01)
  *H01L 29/786* (2006.01)
  *H01L 29/10* (2006.01)
  *H10B 12/00* (2023.01)

(52) U.S. Cl.
  CPC ........... *H10B 12/34* (2023.02); *H10B 12/488* (2023.02); *H10B 12/50* (2023.02); *H01L 21/823425* (2013.01); *H01L 21/823462* (2013.01); *H01L 29/42376* (2013.01); *H01L 29/66621* (2013.01); *H01L 29/7834* (2013.01); *H01L 29/7848* (2013.01); *H01L 29/78675* (2013.01)

(56) References Cited

U.S. PATENT DOCUMENTS

| | | | | |
|---|---|---|---|---|
| 2003/0011002 | A1* | 1/2003 | Takaura | H01L 21/76895 257/E21.507 |
| 2007/0082440 | A1* | 4/2007 | Shiratake | H01L 29/66621 257/E21.654 |
| 2007/0148876 | A1* | 6/2007 | Yu | H01L 29/66621 438/589 |
| 2008/0017904 | A1* | 1/2008 | Akiyama | G11C 7/18 257/E21.429 |
| 2009/0053880 | A1* | 2/2009 | Manabe | H01L 21/823418 257/E21.473 |
| 2009/0242980 | A1* | 10/2009 | Inoue | H01L 29/66621 257/334 |
| 2009/0294874 | A1* | 12/2009 | Lee | H01L 29/7851 438/270 |
| 2010/0006932 | A1* | 1/2010 | Matsubara | H01L 21/823462 257/334 |
| 2011/0156119 | A1* | 6/2011 | Chung | H10B 12/09 257/306 |
| 2012/0187475 | A1* | 7/2012 | Yamazaki | H01L 29/4236 257/330 |
| 2013/0285138 | A1* | 10/2013 | Vega | H01L 29/0684 438/270 |
| 2015/0162445 | A1* | 6/2015 | Wu | H01L 29/7833 438/197 |
| 2016/0104708 | A1* | 4/2016 | Kim | H01L 29/0692 257/369 |
| 2017/0069726 | A1 | 3/2017 | Kye et al. | |
| 2018/0012899 | A1 | 1/2018 | Cheng | |

FOREIGN PATENT DOCUMENTS

| | | | | |
|---|---|---|---|---|
| KR | 20060107406 A | * | 10/2006 | ..... H01L 21/823412 |
| TW | I360864 B | * | 3/2012 | |

* cited by examiner

SEMICONDUCTOR DEVICE AND METHOD FOR FABRICATING THE SAME

CROSS-REFERENCE TO RELATED APPLICATION

This application is a divisional application of U.S. Non-Provisional application Ser. No. 16/678,231 filed Nov. 8, 2019, which is incorporated herein by reference in its entirety.

TECHNICAL FIELD

The present disclosure relates to a method for fabricating a semiconductor device, and more particularly, to a method for fabricating a semiconductor device with a flat surface.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process and are continuously increasing. Therefore, challenges remain in achieving improved quality, yield, performance and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a gate structure positioned on the substrate, and a plurality of word lines positioned apart from the gate structure, wherein a top surface of the gate structure and top surfaces of the plurality of word lines are at a same vertical level.

In some embodiments, the semiconductor device further comprises a first insulating layer positioned on the substrate and a second insulating layer positioned on the first insulating layer; wherein the gate structure is positioned in the first insulating layer, and the top surface of the gate structure is even with a top surface of the second insulating layer.

In some embodiments, the gate structure comprises a gate insulating film positioned on the substrate, a gate first conductive film positioned on the gate insulating film, a gate second conductive film positioned on the gate first conductive film, and a gate mask film positioned on the gate second conductive film; wherein a top surface of the gate mask film is even with the top surface of the second insulating layer.

In some embodiments, the plurality of word lines comprise a plurality of word line channel films inwardly positioned in the first insulating layer and the substrate, lower portions of the plurality of word line channel films are positioned so as to penetrate an upper portion of the substrate, and upper portions of the plurality of word line channel films are positioned in the first insulating layer.

In some embodiments, the plurality of word lines comprise a plurality of word line insulating films positioned on the plurality of word line channel films, a plurality of word line electrodes positioned on the plurality of word line insulating films, and a plurality of word line capping films positioned on the plurality of word line electrodes; and top surfaces of the plurality of word line capping films are even with the top surface of the second insulating layer.

In some embodiments, the semiconductor device further comprises a plurality of conductive regions positioned adjacent to the upper portions of the plurality of word line channel films; wherein top surfaces of the plurality of conductive regions are even with the top surface of the second insulating layer, and bottom surfaces of the plurality of conductive regions contact a top surface of the substrate.

In some embodiments, the semiconductor device further comprises a first isolation structure positioned in the substrate; wherein the first isolation structure defines a peripheral active region of the substrate and the gate structure is located in the peripheral active region.

In some embodiments, the semiconductor device further comprises a second isolation structure positioned in the substrate; wherein the second isolation structure defines an array active region of the substrate, and the plurality of word lines and the plurality of conductive regions are located in the array active region.

In some embodiments, a ratio of a depth of the first isolation structure to a depth of the second isolation structure is between about 1:2 and about 1:5.

In some embodiments, a ratio of a depth of the lower portions of the plurality of word line channel films to a depth of the second isolation structure is between about 1:3 and about 1:10.

In some embodiments, the gate structure comprises a pair of first spacers attached to sidewalls of the gate mask film, the gate second conductive film, the gate first conductive film, and the gate insulating film.

In some embodiments, the semiconductor device further comprises a pair of lightly-doped regions positioned adjacent to the gate insulating film and in the substrate.

In some embodiments, the semiconductor device further comprises a pair of heavily-doped regions positioned adjacent to the pair of first spacers and in the substrate.

In some embodiments, the semiconductor device further comprises a pair of gate stress regions positioned adjacent to the pair of first spacers and in the substrate.

In some embodiments, the semiconductor device further comprises a plurality of stress regions positioned between the plurality of conductive regions and the substrate.

Another aspect of the present disclosure provides a method for fabricating a semiconductor device including providing a substrate, forming a gate structure on the substrate, and forming a plurality of word lines having top surfaces at a same vertical level as a top surface of the gate structure.

In some embodiments, the gate structure comprises a gate insulating film, a gate first conductive film, a gate second conductive film, and a gate mask film, and forming the gate structure on the substrate comprises: sequentially forming a gate insulating layer, a gate first conductive layer, a gate second conductive layer, and a gate mask layer on the substrate; patterning the gate mask layer with first mask segments; performing an etch process to remove portions of the gate insulating layer, the gate first conductive layer, the gate second conductive layer, and the gate mask layer; and concurrently forming the gate insulating film on the substrate, the gate first conductive film on the gate insulating film, the gate second conductive film on the gate first conductive film, and the gate mask film on the gate second conductive film.

In some embodiments, the method for fabricating the semiconductor device further comprises: forming a pair of lightly-doped regions adjacent to the gate insulating film and in the substrate; forming a pair of first spacers attached to two sides of the gate structure; and forming a pair of heavily-doped regions adjacent to the pair of first spacers and in the substrate.

In some embodiments, the method for fabricating the semiconductor device further comprises: forming a first insulating layer on the substrate; wherein the gate structure is formed in the first insulating layer.

In some embodiments, forming the plurality of word lines having the top surfaces at the same vertical level as the top surface of the gate structure comprises: forming a plurality of word line trenches penetrating through the first insulating layer and into the substrate; forming a plurality of word line channel films in the plurality of word line trenches; forming a plurality of word line insulating films on the plurality of word line channel films; forming a plurality of word line electrodes on the plurality of word line insulating films; forming a second insulating layer on the first insulating layer; performing an etching process to remove portions of the second insulating layer and concurrently form a plurality of word line capping films on the plurality of word line electrodes; and performing a planarization process to make the top surfaces of the plurality of word lines and the top surface of the gate structure at the same vertical level.

Due to the design of the semiconductor device of the present disclosure, the semiconductor device may have a substantially flat top surface. The substantially flat top surface facilitates subsequent semiconductor processes. Therefore, the yield and quality of the semiconductor device may be improved. In addition, the pair of gate stress regions or the plurality of stress regions may increase the carrier mobility of the semiconductor device; therefore, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
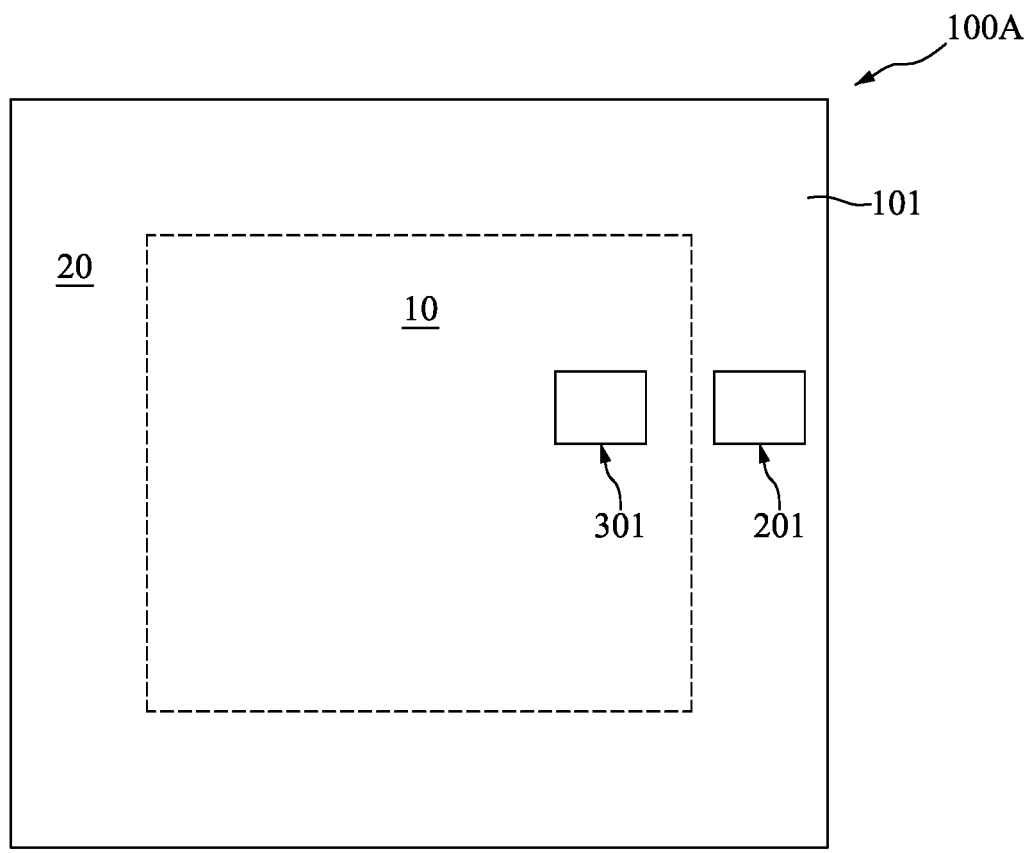
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to," or "coupled to" another element or layer, it can be directly connected to or coupled to another element or layer or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the descriptions of the present disclosure, above (or up) corresponds to the direction of the arrow of the direction Z, and below (or down) corresponds to the opposite direction of the arrow of the direction Z.

It should be noted that, in the descriptions of the present disclosure, when an element A is referred to as being "even with" another element B, it means the element A is disposed at a same vertical level as the element B.

Figure 2:
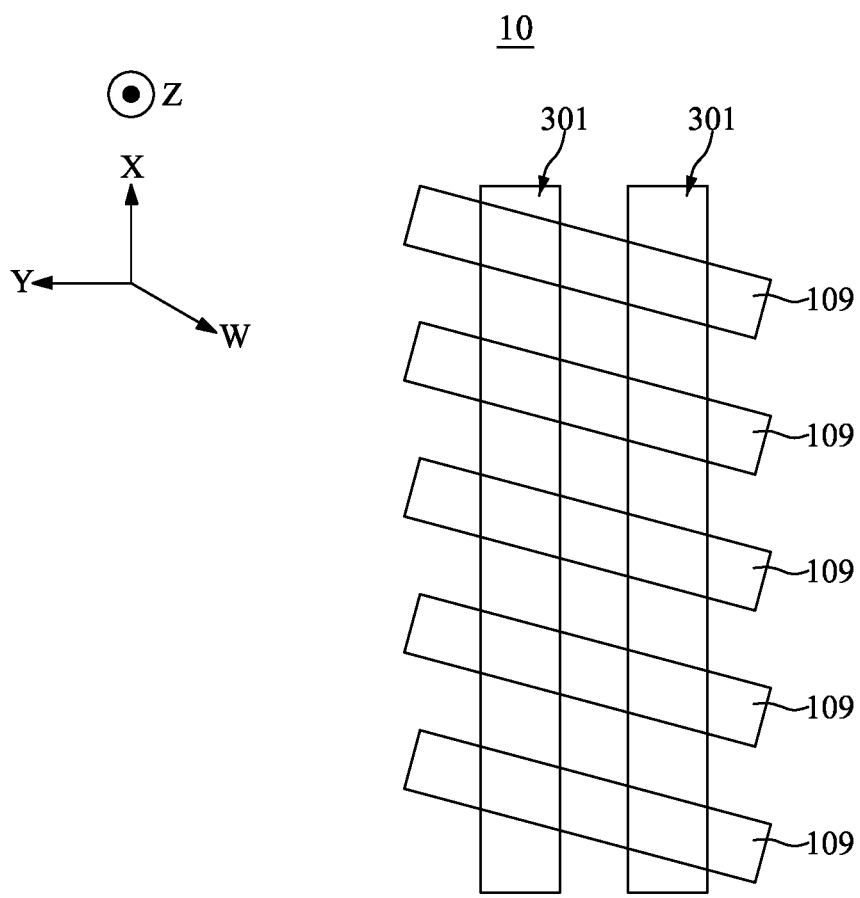
FIG. 2 illustrates, in a schematic top-view diagram, part of the semiconductor device in accordance with one embodiment of the present disclosure.
Figure 3:
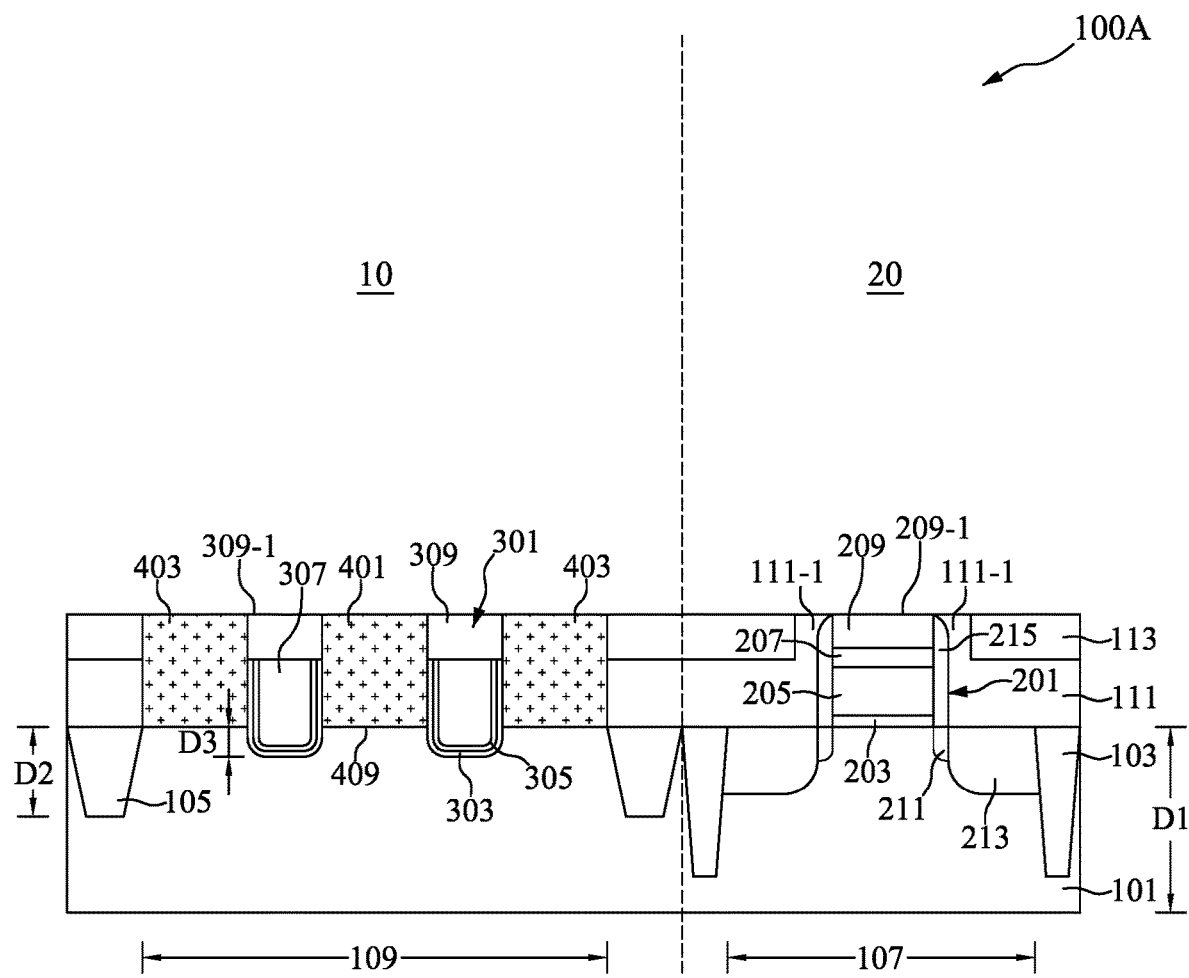
FIG. 3 illustrates, in a schematic cross-sectional view diagram, the semiconductor device in accordance with one embodiment of the present disclosure.

FIG. 1 illustrates, in a schematic top-view diagram, a semiconductor device 100A in accordance with one embodiment of the present disclosure. FIG. 2 illustrates, in a schematic top-view diagram, part of the semiconductor device 100A in accordance with one embodiment of the present disclosure. FIG. 3 illustrates, in a schematic cross-sectional view diagram, the semiconductor device 100A in accordance with one embodiment of the present disclosure.

With reference to FIGS. 1 to 3, in the embodiment depicted, the semiconductor device 100A may include a substrate 101, a first isolation structure 103, a second isolation structure 105, a first insulating layer 111, a second insulating layer 113, a gate structure 201, a pair of lightly-doped regions 211, a pair of heavily-doped regions 213, a pair of first spacers 215, a plurality of word lines 301, and a plurality of conductive regions.

With reference to FIGS. 1 to 3, in the embodiment depicted, the substrate 101 may include an array area 10 and a peripheral area 20. The array area 10 may be in the center of the substrate 101. The peripheral area 20 may surround the array area 10. The substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may have a first lattice constant and a crystal orientation <100>.

Alternatively, in another embodiment, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof.

With reference to FIGS. 1 to 3, in the embodiment depicted, the first isolation structure 103 may be disposed in the peripheral area 20 of the substrate 101 and may define a peripheral active region 107 at the peripheral area 20. The first isolation structure 103 may have a first depth D1. The first isolation structure 103 may be formed of, for example, an insulating material such as silicon oxide, silicon nitride, silicon oxynitride, silicon nitride oxide, or fluoride-doped silicate. It should be noted that the peripheral active region 107 may be a portion of the substrate 101 enclosed by the first isolation structure 103 and a space above that portion of the substrate 101 enclosed by the first isolation structure 103.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 to 3, in the embodiment depicted, the second isolation structure 105 may be disposed in the array area 10 of the substrate 101 and may define a plurality of array active regions 109 at the array area 10. The second isolation structure 105 may have a second depth D2. The second depth D2 of the second isolation structure 105 may be less than the first depth D1 of the first isolation structure 103. A ratio of the second depth D2 of the second isolation structure 105 to the first depth D1 of the first isolation structure 103 may be between about 1:2 and about 1:5. The second isolation structure 105 may be formed of a same material as the first isolation structure 103, but is not limited thereto. It should be noted that the plurality of array active regions 109 may be comprised of portions of the substrate 101 enclosed by the second isolation structure 105 and spaces above such portions of the substrate 101 enclosed by the second isolation structure 105.

With reference to FIGS. 1 to 3, in the embodiment depicted, the first insulating layer 111 may be disposed on the substrate 101. The first insulating layer 111 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but is not limited thereto.

With reference to FIGS. 1 to 3, in the embodiment depicted, the semiconductor device 100A may include protruding first insulating segments 111-1. The protruding first insulating segments 111-1 may be disposed on a top surface of the first insulating layer 111 and located at the peripheral area 20. Top surfaces of the protruding first insulating segments 111-1 may be even with the top surface of the second insulating layer 113. The protruding first insulating segments 111-1 may be formed of a same material as the first insulating layer 111.

With reference to FIGS. 1 to 3, in the embodiment depicted, the second insulating layer 113 may be disposed on the first insulating layer 111. A portion of the second insulating layer 113 located at the peripheral area 20 may surround the protruding first insulating segments 111-1. The second insulating layer 113 may be formed of a same material as the first insulating layer 111, but is not limited thereto.

With reference to FIGS. 1 to 3, in the embodiment depicted, the gate structure 201 may be disposed in the peripheral active region 107 of the peripheral area 20. The gate structure 201 may be disposed in the first insulating layer 111 and the protruding first insulating segments 111-1. A lower portion of the gate structure 201 may be disposed on the top surface of the substrate 101 and in the first insulating layer 111. An upper portion of the gate structure

201 may be surrounded by the protruding first insulating segments 111-1. A top surface of the gate structure 201 may be even with a top surface of the second insulating layer 113. The gate structure 201 may include a gate insulating film 203, a gate first conductive film 205, a gate second conductive film 207, and a gate mask film 209.

With reference to FIGS. 1 to 3, in the embodiment depicted, the gate insulating film 203 may be disposed in the peripheral active region 107 of the peripheral area 20. The gate insulating film 203 may be disposed on the top surface of the substrate 101 and in the first insulating layer 111. The gate insulating film 203 may have a thickness between about 0.5 nm and about 5.0 nm. Preferably, the thickness of the gate insulating film 203 may be between about 0.5 nm and about 2.5 nm. It should be noted that the thickness of the gate insulating film 203 may be set to an arbitrary range depending on the circumstances.

The gate insulating film 203 may be formed of, for example, an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof. Alternatively, in another embodiment, the insulating material may be silicon oxide, silicon nitride, silicon oxynitride, silicon nitride oxide, or the like.

With reference to FIGS. 1 to 3, in the embodiment depicted, the gate first conductive film 205 may be disposed on the gate insulating film 203 and in the first insulating layer 111. The gate first conductive film 205 may have a thickness between about 150 nm and about 300 nm. The gate first conductive film 205 may be formed of, for example, doped polysilicon. The gate second conductive film 207 may be disposed on the gate first conductive film 205 and in the first insulating layer 111. The gate second conductive film 207 may be formed of, for example, metal silicide. The gate mask film 209 may be disposed on the gate second conductive film 207 and may be surrounded by the protruding first insulating segments 111-1. A top surface 209-1 of the gate mask film 209 may be even with the top surface of the second insulating layer 113. The gate mask film 209 may be formed of, for example, silicon nitride, silicon oxynitride, silicon nitride oxide, or the like.

With reference to FIGS. 1 to 3, in the embodiment depicted, the pair of lightly-doped regions 211 may be disposed in the peripheral active region 107. The pair of lightly-doped regions 211 may be respectively correspondingly disposed adjacent to the gate insulating film 203 and in the substrate 101. The pair of lightly-doped regions 211 may be doped with a dopant such as boron, phosphorus, arsenic, or antimony.

With reference to FIGS. 1 to 3, in the embodiment depicted, the pair of first spacers 215 may be attached to two sides of the gate structure 201. The pair of first spacers 215 may be attached to sidewalls of the gate mask film 209, sidewalls of the gate second conductive film 207, sidewalls of the gate first conductive film 205, and sidewalls of the gate insulating film 203. Upper portions of the pair of first spacers 215 may be surrounded by the protruding first insulating segments 111-1. Lower portions of the pair of first spacers 215 may be disposed in the first insulating layer 111. Bottoms of the pair of first spacers 215 may be respectively correspondingly disposed on portions of the pair of lightly-doped regions 211. The pair of first spacers 215 may be formed of, for example, polysilicon, silicon oxide, or silicon nitride. In the embodiment depicted, the pair of first spacers 215 may be formed of silicon oxide.

With reference to FIGS. 1 to 3, in the embodiment depicted, the pair of heavily-doped regions 213 may be disposed in the peripheral active region 107. The pair of heavily-doped regions 213 may be disposed adjacent to the pair of first spacers 215 and in the substrate 101. The pair of heavily-doped regions 213 may be disposed adjacent to the pair of lightly-doped regions 211. The pair of heavily-doped regions 213 may be doped with a same dopant as the pair of lightly-doped regions 211. The pair of heavily-doped regions 213 may have a dopant concentration greater than a dopant concentration of the pair of lightly-doped regions 211.

With reference to FIGS. 1 to 3, in the embodiment depicted, the plurality of word lines 301 may be located at the array area 10. The plurality of word lines 301 may intersect the plurality of array active regions 109 in a top-view diagram. The plurality of word lines 301 may extend along a first direction X and the plurality of array active regions 109 may extend along a second direction diagonal with respect to the first direction X. The plurality of word lines 301 may be disposed in the first insulating layer 111, the second insulating layer 113, and the substrate 101. Lower portions of the plurality of word lines 301 may be disposed in the substrate 101. Upper portions of the plurality of word lines 301 may be disposed in the first insulating layer 111 and the second insulating layer 113. Top surfaces of the plurality of word lines 301 may be even with the top surface of the second insulating layer 113. The plurality of word lines 301 may include a plurality of word line channel films 303, a plurality of word line insulating films 305, a plurality of word line electrodes 307, and a plurality of word line capping films 309.

With reference to FIGS. 1 to 3, in the embodiment depicted, the plurality of word line channel films 303 may be inwardly disposed in the first insulating layer 111 and the substrate 101. Upper portions of the plurality of word line channel films 303 may be disposed in the first insulating layer 111. Top surfaces of the plurality of word line channel films 303 may be even with a top surface of the first insulating layer 111. Lower portions of the plurality of word line channel films 303 may be disposed in the substrate 101. The lower portions of the plurality of word line channel films 303 may have a third depth D3. A ratio of the third depth D3 of the lower portions of the plurality of word line channel films 303 to the second depth D2 of the second isolation structure 105 may be between about 1:3 and about 1:10. Bottoms of the plurality of word line channel films 303 may be flat. Each of the plurality of word line channel films 303 may have a U-shaped cross-sectional profile. The plurality of word line channel films 303 may be formed of, for example, doped polysilicon or undoped polysilicon. For example, doped polysilicon may be doped with a dopant such as phosphorus, arsenic, or antimony.

With reference to FIGS. 1 to 3, in the embodiment depicted, the plurality of word line insulating films 305 may be respectively correspondingly disposed on the plurality of word line channel films 303 and in the first insulating layer 111. In other words, the plurality of word line insulating films 305 may respectively correspondingly cover inner surfaces of the plurality of word line channel films 303. Top surfaces of the plurality of word line insulating films 305 may be even with the top surfaces of the plurality of word line channel films 303 and the top surface of the first insulating layer 111. Each of the plurality of word line insulating films 305 may have a U-shaped cross-sectional profile. The plurality of word line insulating films 305 may be formed of, for example, an insulating material having a dielectric constant of about 4.0 or greater. Alternatively, in another embodiment, the insulating material may be silicon oxide, silicon nitride, silicon oxynitride, silicon nitride oxide, or the like.

With reference to FIGS. 1 to 3, in the embodiment depicted, the plurality of word line electrodes 307 may be respectively correspondingly disposed on the plurality of word line insulating films 305 and in the first insulating layer 111. Top surfaces of the plurality of word line electrodes 307 may be even with the top surface of the first insulating layer 111, the top surfaces of the plurality of word line insulating films 305, and the top surfaces of the plurality of word line channel films 303. The plurality of word line electrodes 307 may be formed of, for example, a conductive material such as doped polysilicon, silicon germanium, metal, metal alloy, metal silicide, metal nitride, metal carbide, or a combination including multilayers thereof. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like.

With reference to FIGS. 1 to 3, in the embodiment depicted, the plurality of word line capping films 309 may be respectively correspondingly disposed on the plurality of word line electrodes 307 and in the second insulating layer 113. The plurality of word line capping films 309 may have a same thickness as the second insulating layer 113. Top surfaces 309-1 of the plurality of word line capping films 309 may be even with the top surface of the second insulating layer 113. The plurality of word line capping films 309 may be formed of a single layer including an insulating material having a dielectric constant of about 4.0 or greater. Alternatively, in another embodiment, the plurality of word line capping films 309 may be formed of stacked layers including a bottom capping layer disposed on the plurality of word line electrodes 307 and a top capping layer disposed on the bottom capping layer. The bottom capping layer may be formed of an insulating material having a dielectric constant of about 4.0 or greater. A top surface of the top capping layer may be even with the top surface of the second insulating layer 113. The top capping layer may be formed of a low dielectric-constant material such as silicon oxide, or the like. The top capping layer formed of the low dielectric-constant material may reduce electric field on the top surface of second insulating layer 113; therefore, leakage current may be reduced.

With reference to FIGS. 1 to 3, in the embodiment depicted, the plurality of conductive regions may be disposed above the plurality of array active regions 109 and in the first insulating layer 111 and the second insulating layer 113. For each of the plurality of array active regions 109, the plurality of conductive regions may include a first conductive region 401 and two second conductive regions 403. The first conductive region 401 may be disposed between an adjacent pair of the plurality of word lines 301. The two second conductive regions 403 may be respectively correspondingly opposite to the first conductive region 401 and disposed adjacent to the adjacent pair of the plurality of word lines 301. The first conductive region 401 and the two second conductive regions 403 may be respectively correspondingly disposed adjacent to the upper portions of the plurality of word line channel films 303.

With reference to FIGS. 1 to 3, in the embodiment depicted, the top surfaces of the first conductive region 401 and the two second conductive regions 403 may be even with the top surface of the second insulating layer 113 and the top surfaces of the plurality of word line capping films 309. Bottom surfaces of the first conductive region 401 and two second conductive regions 403 may directly contact the top surface of the substrate 101. The plurality of conductive regions may be formed of, for example, doped polysilicon or undoped silicon. When exterior voltages are applied to the plurality of word lines 301 and the plurality of conductive regions, carrier channels may be formed along the plurality of word line channel films 303.

FIGS. 4 to 8 illustrate, in schematic cross-sectional view diagrams, semiconductor devices 100B, 100C, 100D, 100E and 100F in accordance with other embodiments of the present disclosure.

Figure 4:
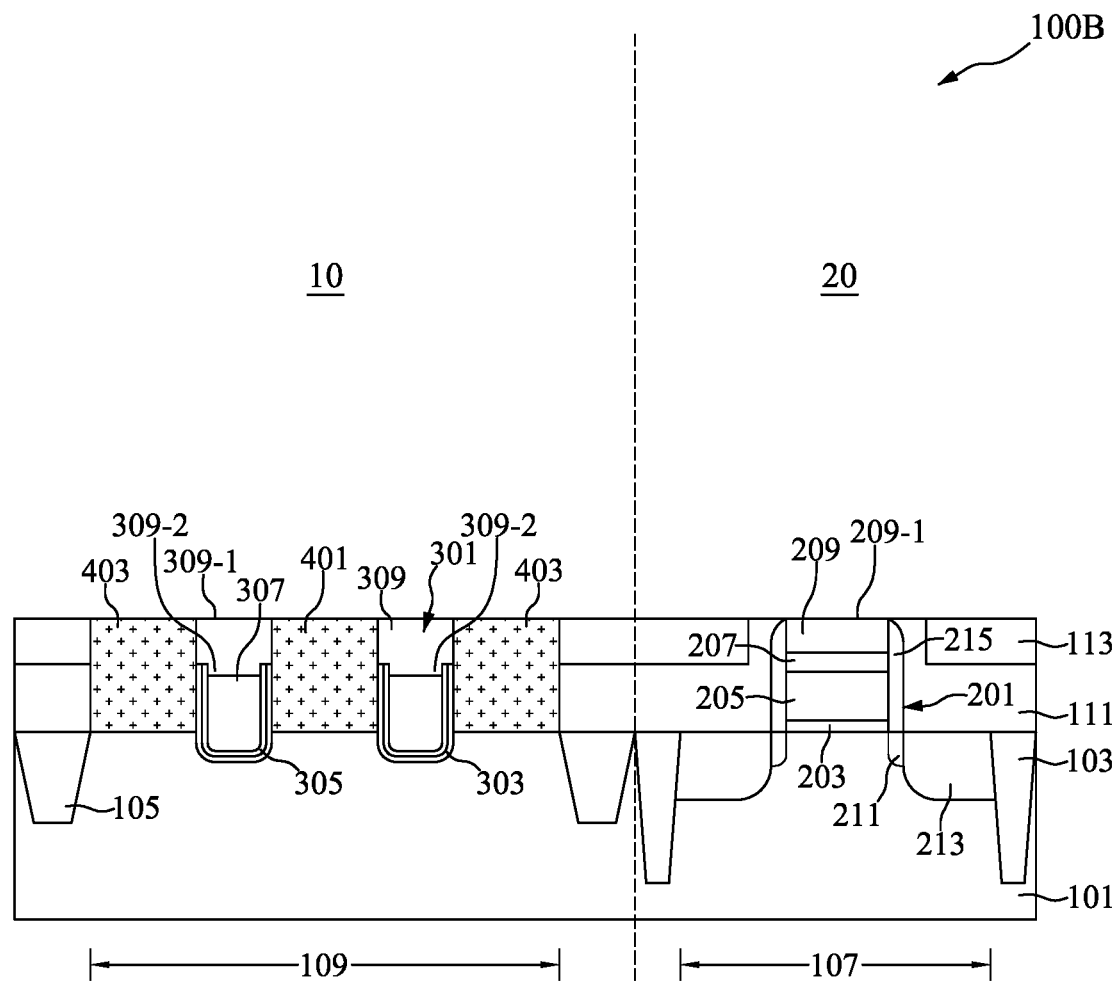
FIGS. 4 to 8 illustrate, in schematic cross-sectional view diagrams, semiconductor devices in accordance with other embodiments of the present disclosure.

With reference to FIG. 4, each of the plurality of word line capping films 309 may include a lower protruding portion 309-2. The lower protruding portions 309-2 may respectively correspondingly protrude from bottom surfaces of the plurality of word line capping films 309. In other words, the lower protruding portions 309-2 may be respectively correspondingly disposed between the plurality of word line capping films 309 and the plurality of word line electrodes 307. Sidewalls of the lower protruding portions 309-2 may respectively correspondingly contact inner surfaces of the plurality of word line insulating films 305. The lower protruding portions 309-2 may be formed of a same material as the plurality of word line capping films 309.

Figure 5:
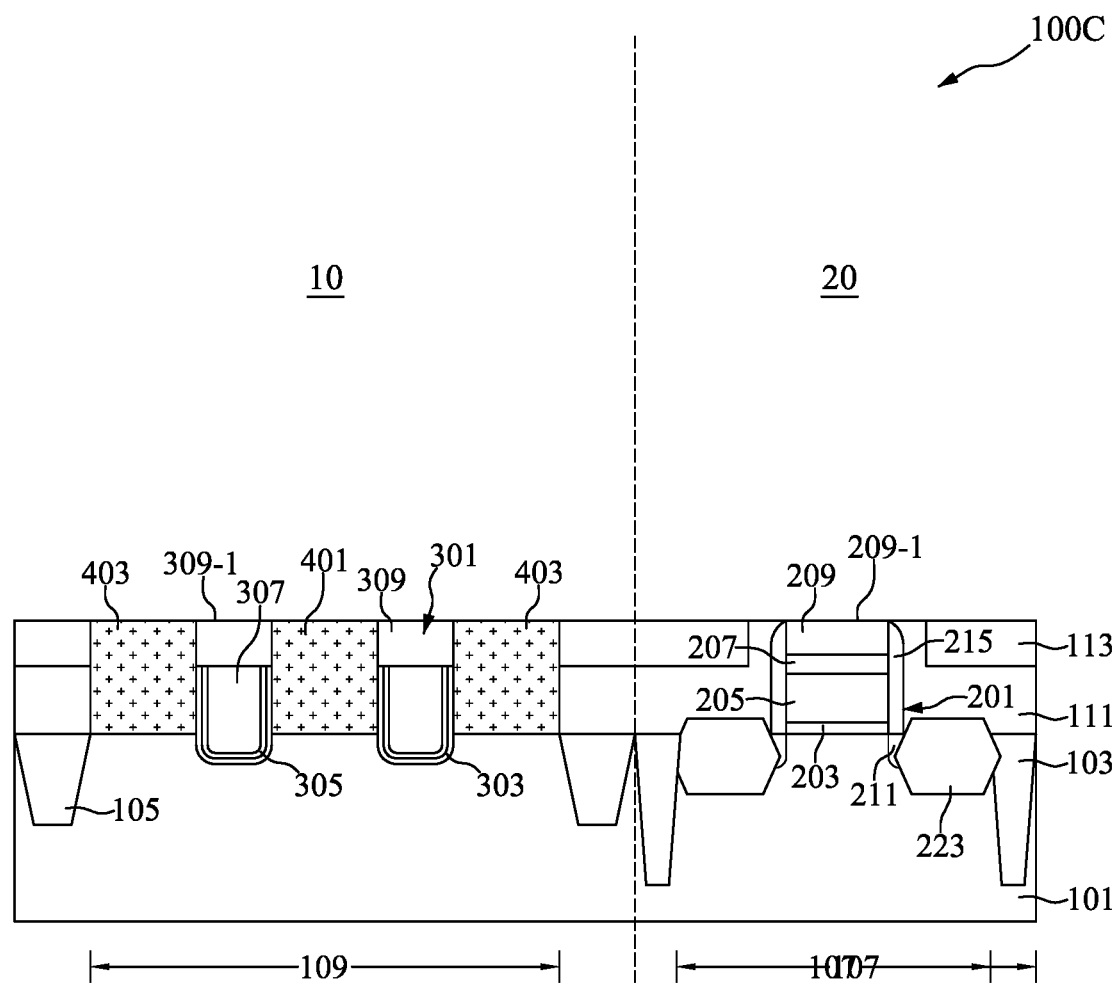

With reference to FIG. 5, the semiconductor device 100C may include a pair of gate stress regions 223. The pair of gate stress regions 223 may be located at the peripheral area 20 and in the peripheral active region 107. Upper portions of the pair of gate stress regions 223 may protrude from the top surface of the substrate 101 and may be disposed adjacent to the pair of first spacers 215. Lower portions of the pair of gate stress regions 223 may be disposed in the substrate 101 and adjacent to the pair of lightly-doped regions 211. The pair of gate stress regions 223 may be formed of a material having a second lattice constant which may be different from the first lattice constant. In the embodiment depicted, the pair of gate stress regions 223 may be formed of, for example, silicon germanium or silicon carbide. Due to the lattice mismatch between the substrate 101 and the pair of gate stress regions 223, the carrier mobility may be increased; therefore, the performance of the semiconductor device 100C may be improved.

Figure 6:
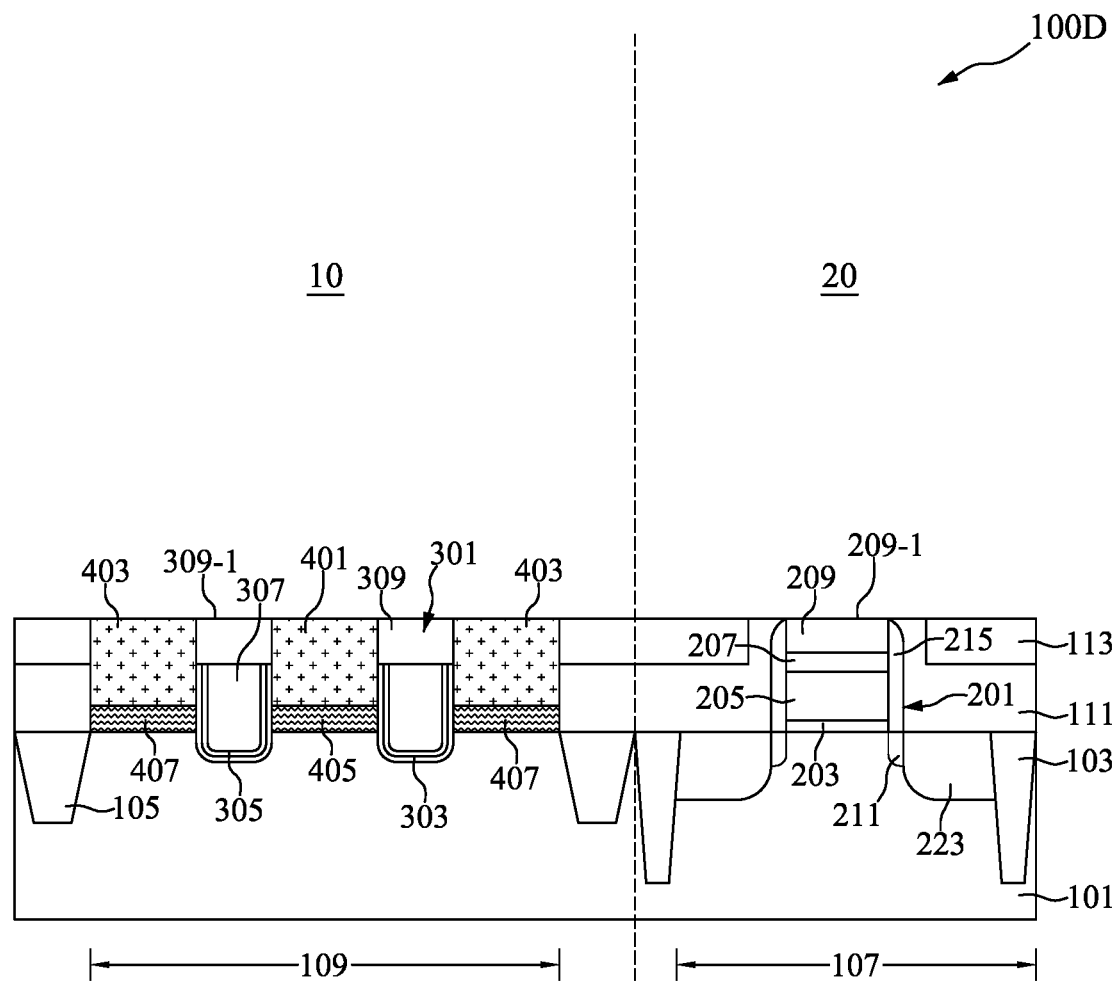

With reference to FIG. 6, the semiconductor device 100D may include a plurality of stress regions. The plurality of stress regions may be located at the array area 10. The plurality of stress regions may be respectively correspondingly disposed between the substrate 101 and the plurality of conductive regions. The plurality of stress regions may include a first stress region 405 and two second stress regions 407. The first stress region 405 may be disposed between the adjacent pair of the plurality of word lines 301 and may contact the outer surfaces of the plurality of word line channel films 303. The first stress region 405 may be disposed between the first conductive region 401 and the substrate 101.

With reference to FIG. 6, the two second stress regions 407 may be respectively correspondingly opposite to the first stress region 405 and disposed adjacent to the adjacent pair of the plurality of word lines 301. The two second stress regions 407 may contact the outer surfaces of the plurality of word line channel films 303. The two second stress regions 407 may be respectively correspondingly disposed between the two second conductive regions 403 and the substrate 101. The first stress region 405 and the two second stress regions 407 may be formed of a material having a third lattice constant which may be different from the first lattice constant. In the embodiment depicted, the first stress region 405 and the two second stress regions 407 may be formed of, for example, silicon carbide. Due to the lattice mismatch between the substrate 101, the first stress region 405 and the two second stress regions 407, the carrier mobility may be increased; therefore, the performance of the semiconductor device 100D may be improved.

Figure 7:
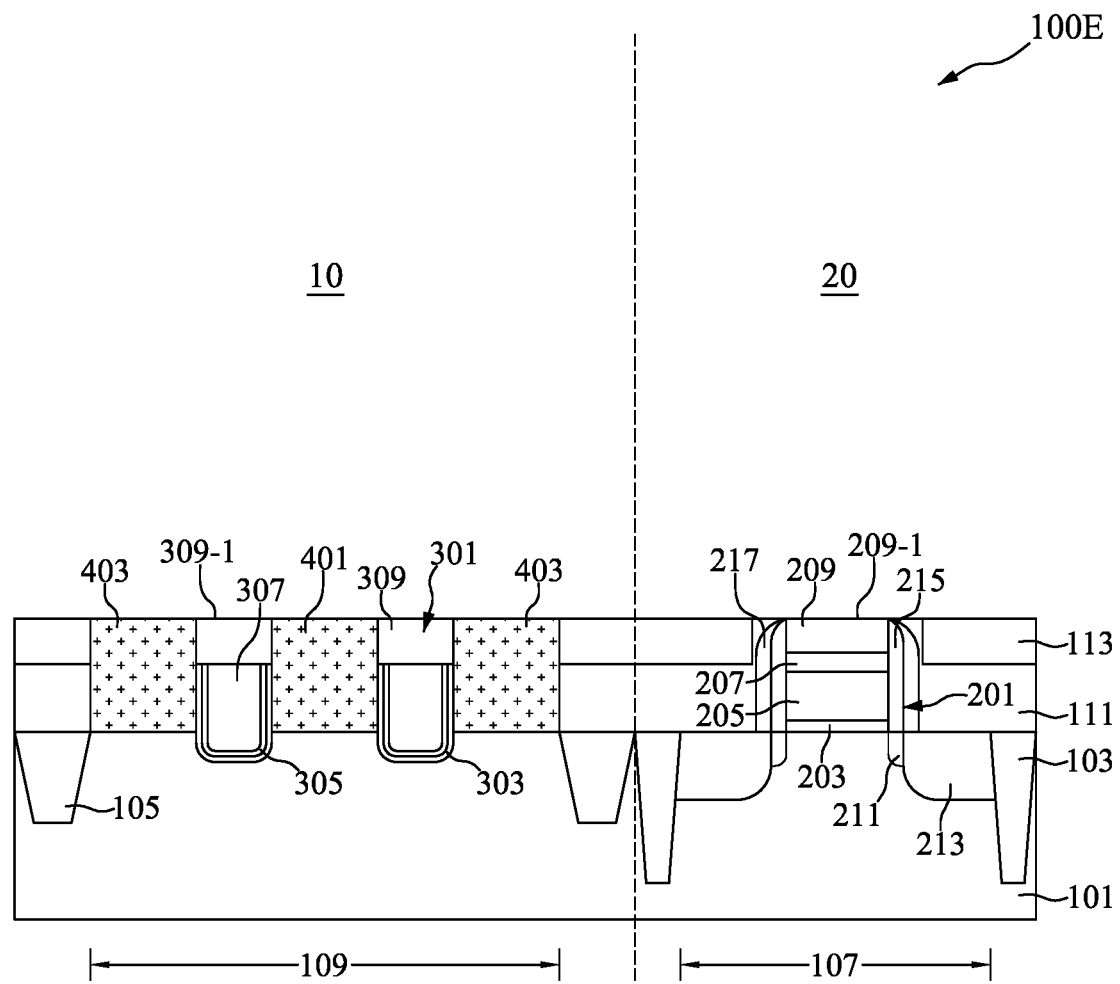

With reference to FIG. 7, the semiconductor device 100E may include a pair of second spacers 217. The pair of second spacers 217 may be formed of, for example, silicon oxide, silicon nitride, or the like. The pair of second spacers 217 may be respectively correspondingly attached to outer surfaces of the pair of first spacers 215. With presence of the pair of second spacers 217, thicknesses of the pair of first spacers 215 may be minimized, thereby reducing overlap capacitance formed among the pair of lightly-doped regions 211, the pair of heavily-doped regions 213, and the gate structure 201. As a result, a performance of the semiconductor device 100E may be improved.

Figure 8:
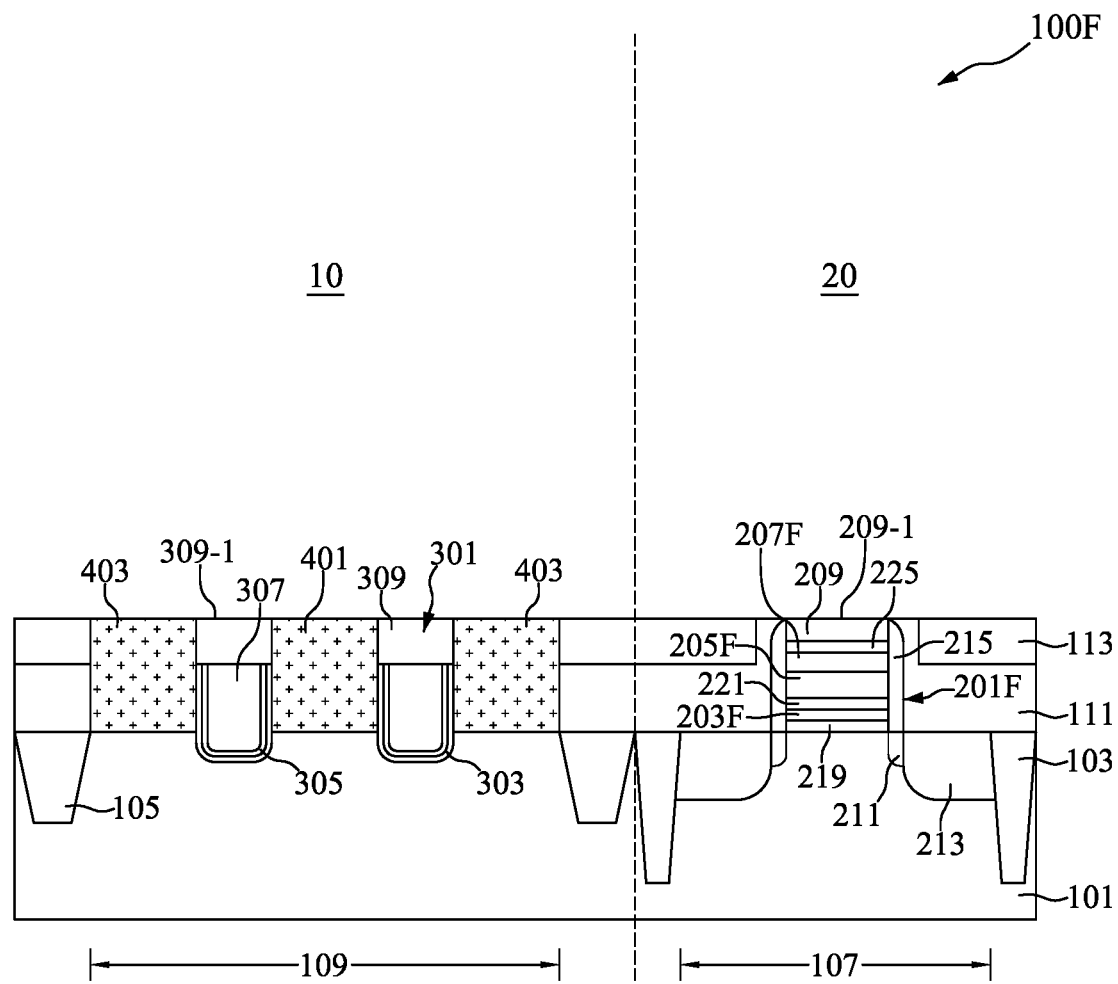

With reference to FIG. 8, the gate structure 201F of the semiconductor device 100F may include a gate dipole film 219, a gate insulating film 203F, a gate capping film 221, a gate first conductive film 205F, a gate second conductive film 207F, a gate filler film 225, and a gate mask film 209. The gate dipole film 219 may be disposed between the substrate 101 and the gate insulating film 203F. The gate dipole film 219 may have a thickness less than 2 nm. The gate dipole film 219 may be formed of a material including one or more of lutetium oxide, lutetium silicon oxide, yttrium oxide, yttrium silicon oxide, lanthanum oxide, lanthanum silicon oxide, barium oxide, barium silicon oxide, strontium oxide, strontium silicon oxide, aluminum oxide, aluminum silicon oxide, titanium oxide, titanium silicon oxide, hafnium oxide, hafnium silicon oxide, zirconium oxide, zirconium silicon oxide, tantalum oxide, tantalum silicon oxide, scandium oxide, scandium silicon oxide, magnesium oxide, and magnesium silicon oxide. The gate dipole film 219 may displace defects in the gate insulating film 203F and may improve the mobility and reliability of the gate structure 201. The gate insulating film 203F may be disposed on the gate dipole film 219 and may be formed of an insulating material having a dielectric constant of about 4.0 or greater.

With reference to FIG. 8, the gate capping film 221 may be disposed on the gate insulating film 203F. The gate capping film 221 may have a thickness between about 10 angstroms and about 15 angstroms and may be formed of, for example, titanium nitride or tantalum nitride. The gate capping film 221 may protect the gate insulating film 203F from damage during subsequent semiconductor processes and may be used to fine-tune a threshold voltage of the gate structure 201. The gate first conductive film 205F may be disposed on the gate capping film 221. The gate first conductive film 205F may have a thickness between about 10 angstroms and about 100 angstroms. The gate first conductive film 205F may be formed of, for example, titanium nitride, tantalum nitride, tantalum carbide, tungsten nitride, or ruthenium.

With reference to FIG. 8, the gate second conductive film 207F may be disposed on the gate first conductive film 205F. The gate second conductive film 207F have a thickness between about 10 angstroms and about 200 angstroms. Preferably, the thickness of the gate second conductive film 207F may be between about 10 angstroms and about 100 angstroms. The gate second conductive film 207F may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. The gate filler film 225 may be disposed on the gate second conductive film 207F and may be formed of, for example, tungsten or aluminum. The gate mask film 209 may be disposed on the gate filler film 225.

Figure 9:
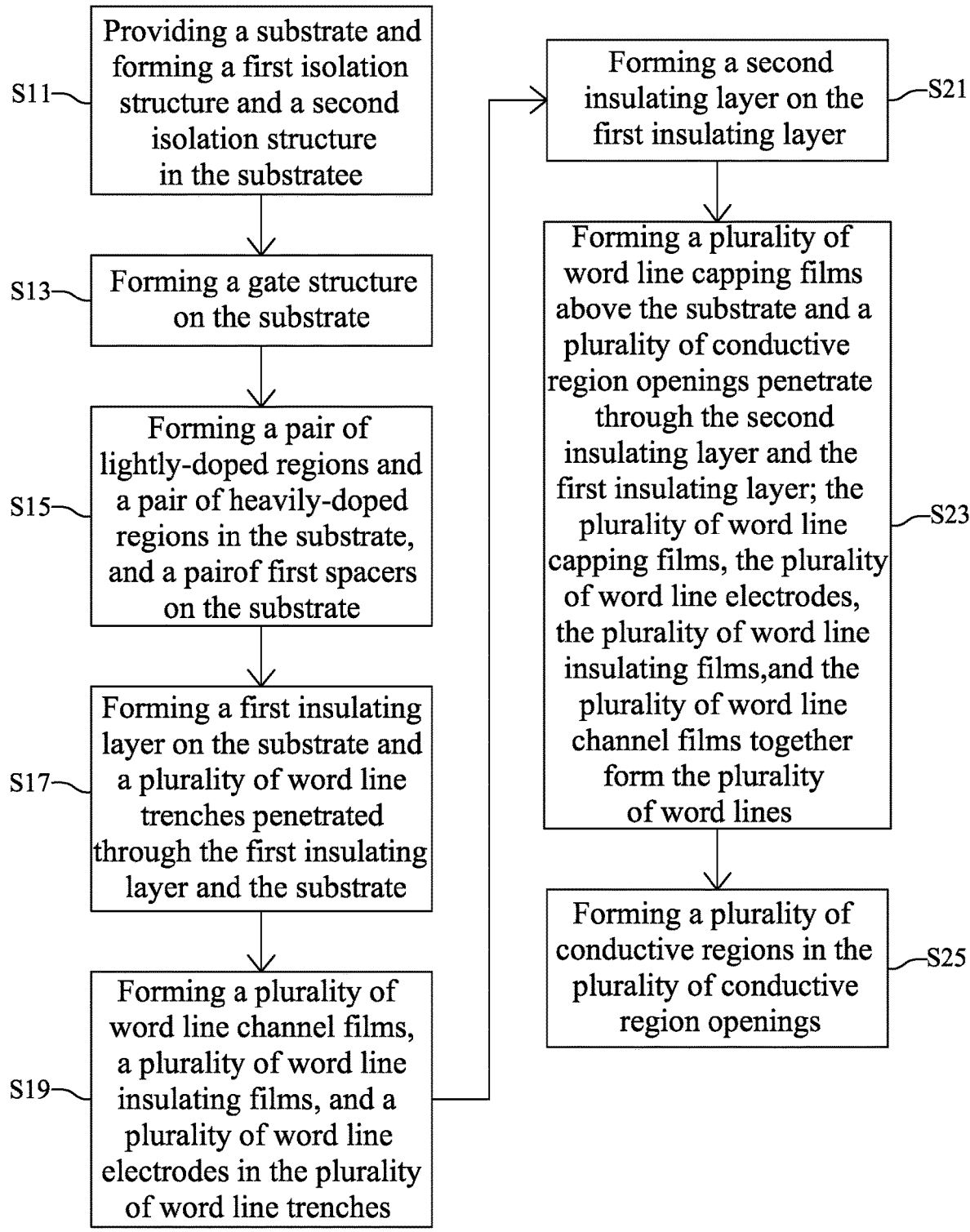
FIG. 9 illustrates, in a flowchart diagram form, a method for fabricating a semiconductor device in accordance with one embodiment of the present disclosure.

FIG. 9 illustrates, in a flowchart diagram form, a method 30 for fabricating a semiconductor device 100A in accordance with one embodiment of the present disclosure. FIGS. 10 to 30 illustrate, in schematic cross-sectional diagrams, a flow of fabricating the semiconductor device 100A in accordance with one embodiment of the present disclosure.

Figure 10:
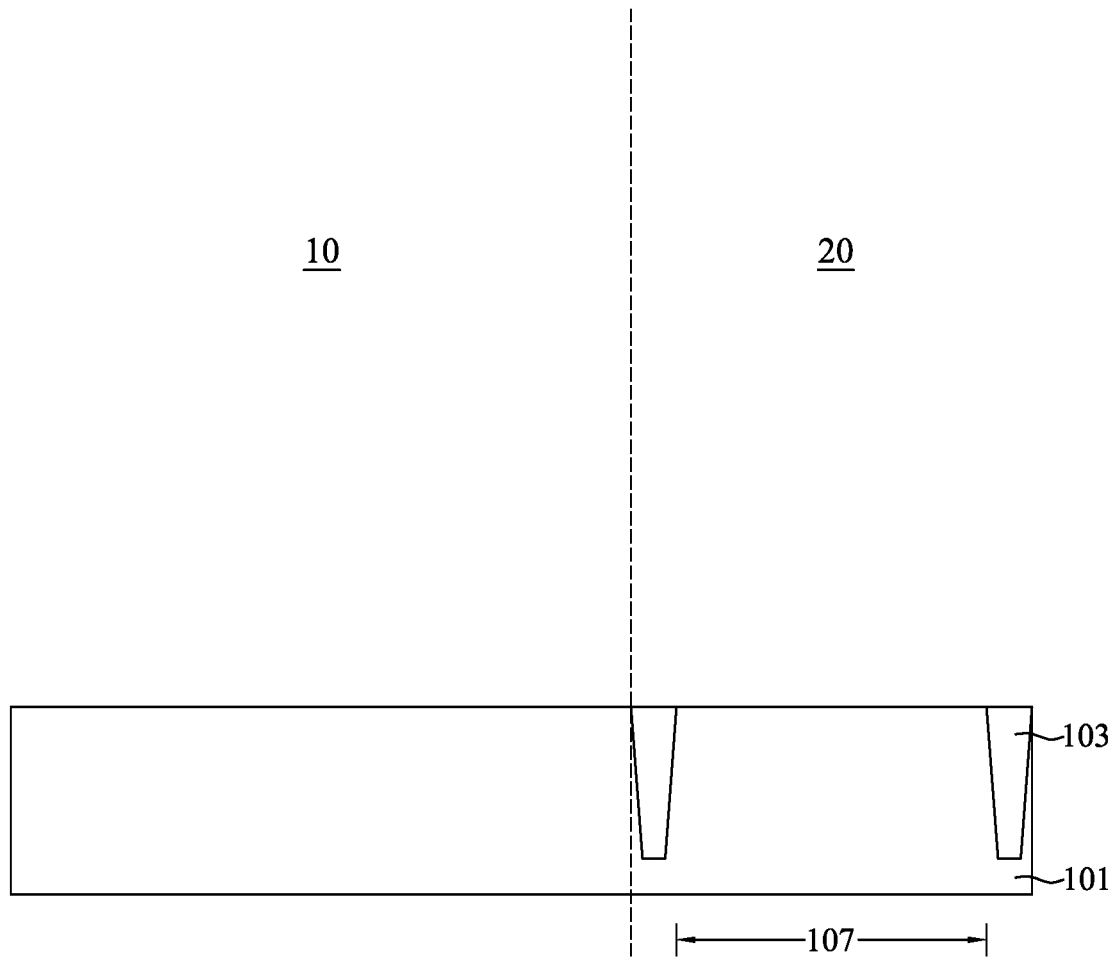
FIGS. 10 to 30 illustrate, in schematic cross-sectional diagrams, a flow of fabricating the semiconductor device in accordance with one embodiment of the present disclosure.
Figure 11:
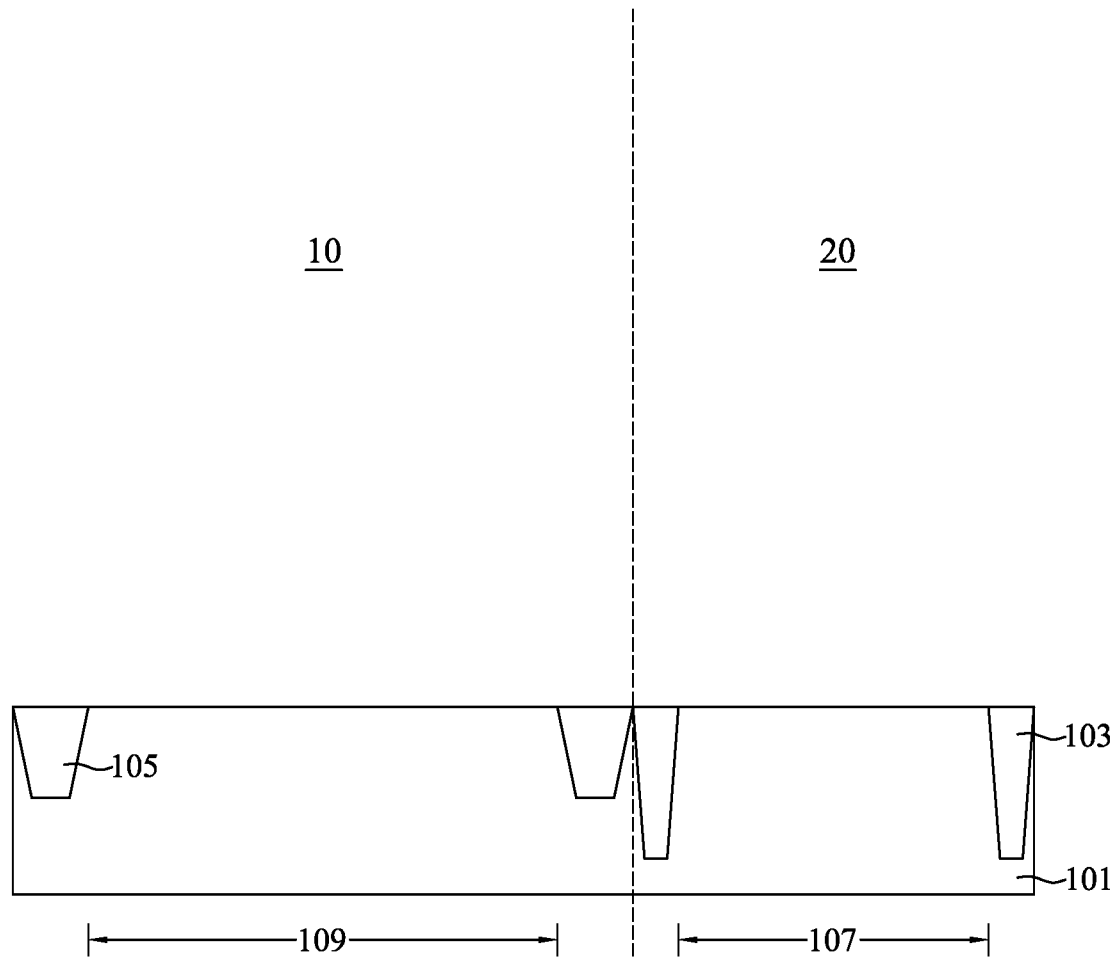

With reference to FIGS. 9, 10, and 11, at step S11, in the embodiment depicted, a substrate 101 may be provided and a first isolation structure 103 and a second isolation structure 105 may be formed in the substrate 101. The substrate 101 may include an array area 10 and a peripheral area 20. The array area 10 may be in the center of the substrate 101. The peripheral area 20 may surround the array area 10. A series of deposition processes may be performed to deposit a pad oxide layer (not shown in FIGS. 10 and 11) and a pad nitride layer (not shown in FIGS. 10 and 11) on the substrate 101. A first photolithography process may be performed to define a position of the first isolation structure 103 located at the peripheral area 20. After the first photolithography process, a first etch process, such as an anisotropic dry etch process, may be performed to form trenches penetrating through the pad oxide layer, the pad nitride layer, and the substrate 101. An insulating material may be deposited into the trenches and a planarization process, such as chemical mechanical polishing, may be subsequently performed to remove excess filling material until the pad nitride layer is exposed.

With reference to FIG. 11, a second photolithography process may be performed to define a position of the second isolation structure 105 located at the array area 10. After the second photolithography process, a second etch process, such as an anisotropic dry etch process, may be performed to form trenches penetrating through the pad oxide layer, the pad nitride layer, and the substrate 101. An insulating material may be deposited into the trenches and a planarization process, such as chemical mechanical polishing, may be subsequently performed to remove excess filling material until a top surface of the substrate 101 is exposed. The first isolation structure 103 and the second isolation structure 105 may be concurrently formed after the planarization process. The first isolation structure 103 may define a peripheral active region 107 located at the peripheral area 20. The second isolation structure 105 may define a plurality of array active regions 109 located at the array area 10. A depth of the first isolation structure 103 may be greater than a depth of the second isolation structure 105.

Figure 12:
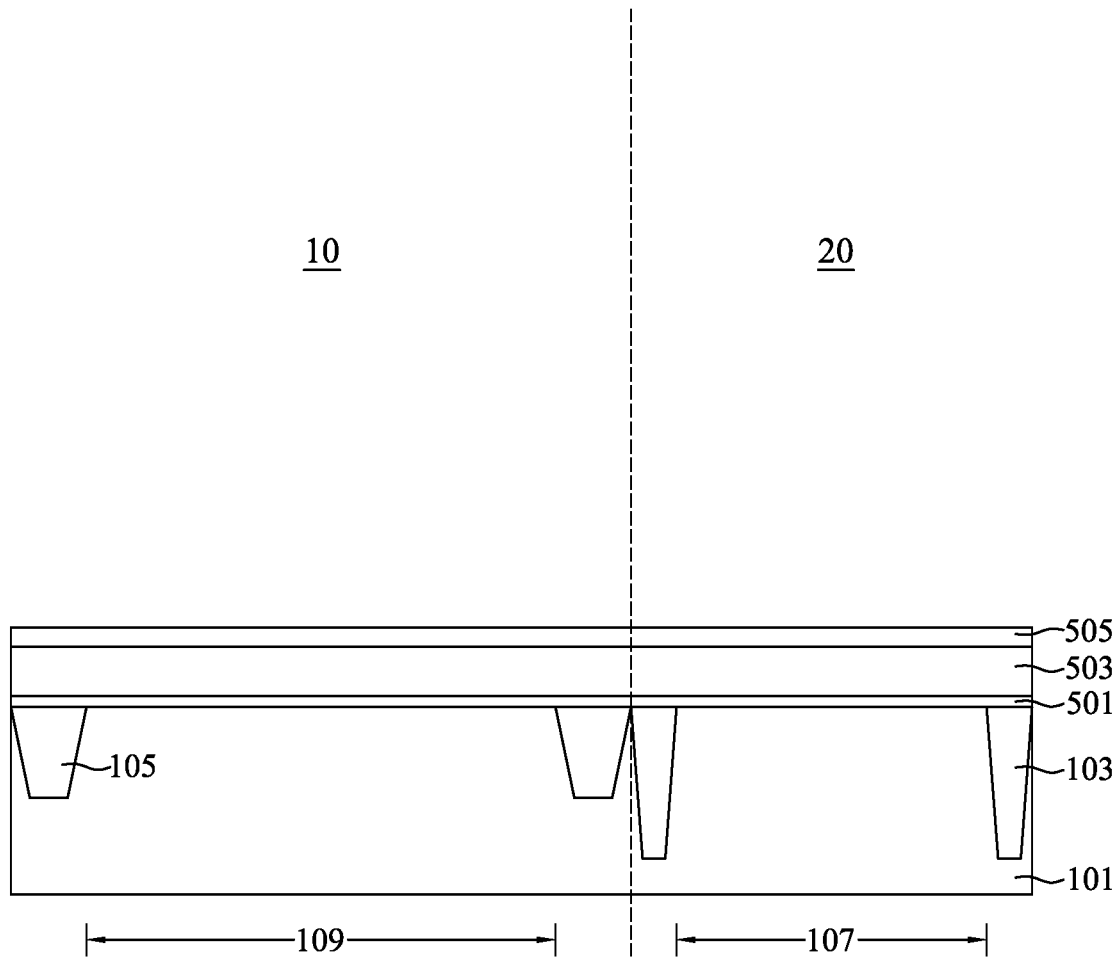

With reference to FIGS. 9 and 12 to 14, at step S13, in the embodiment depicted, a gate structure 201 may be formed on the substrate 101. With reference to FIG. 12, a series of deposition processes may be performed to deposit a gate insulating layer 501, a gate first conductive layer 503, and a gate second conductive layer 505 on the substrate 101. The gate insulating layer 501 may be formed of an insulating material having a dielectric constant of about 4.0 or greater. Alternatively, in another embodiment, the gate insulating layer 501 may be formed of silicon oxide, silicon nitride, silicon oxynitride, silicon nitride oxide, or the like. The gate insulating layer 501 may have a thickness between about 0.5 nm and about 5.0 nm. Preferably, the thickness of the gate insulating layer 501 may be between about 0.5 nm and about 2.5 nm.

Figure 13:
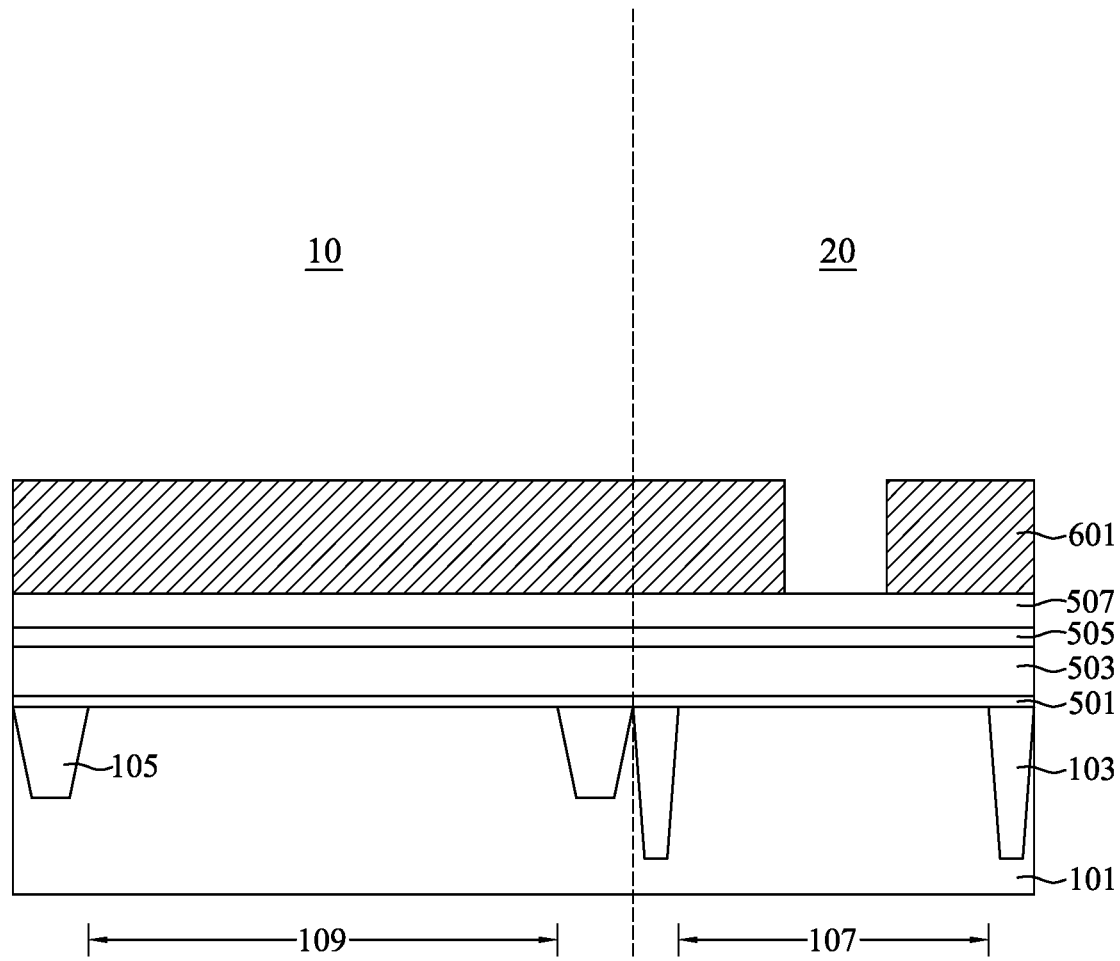

With reference to FIG. 12, the gate first conductive layer 503 may have a thickness between about 150 nm and about 300 nm. The gate first conductive layer 503 may be formed of, for example, doped polysilicon. The gate second conductive layer 505 may be formed of, for example, metal silicide. With reference to FIG. 13, a gate mask layer 507 may be formed on the gate second conductive layer 505. The gate mask layer 507 may be formed of, for example, silicon nitride, silicon oxynitride, silicon nitride oxide, or the like. A photolithography process using first mask segments 601 as a mask may be performed to define a position of the gate structure 201.

Figure 14:
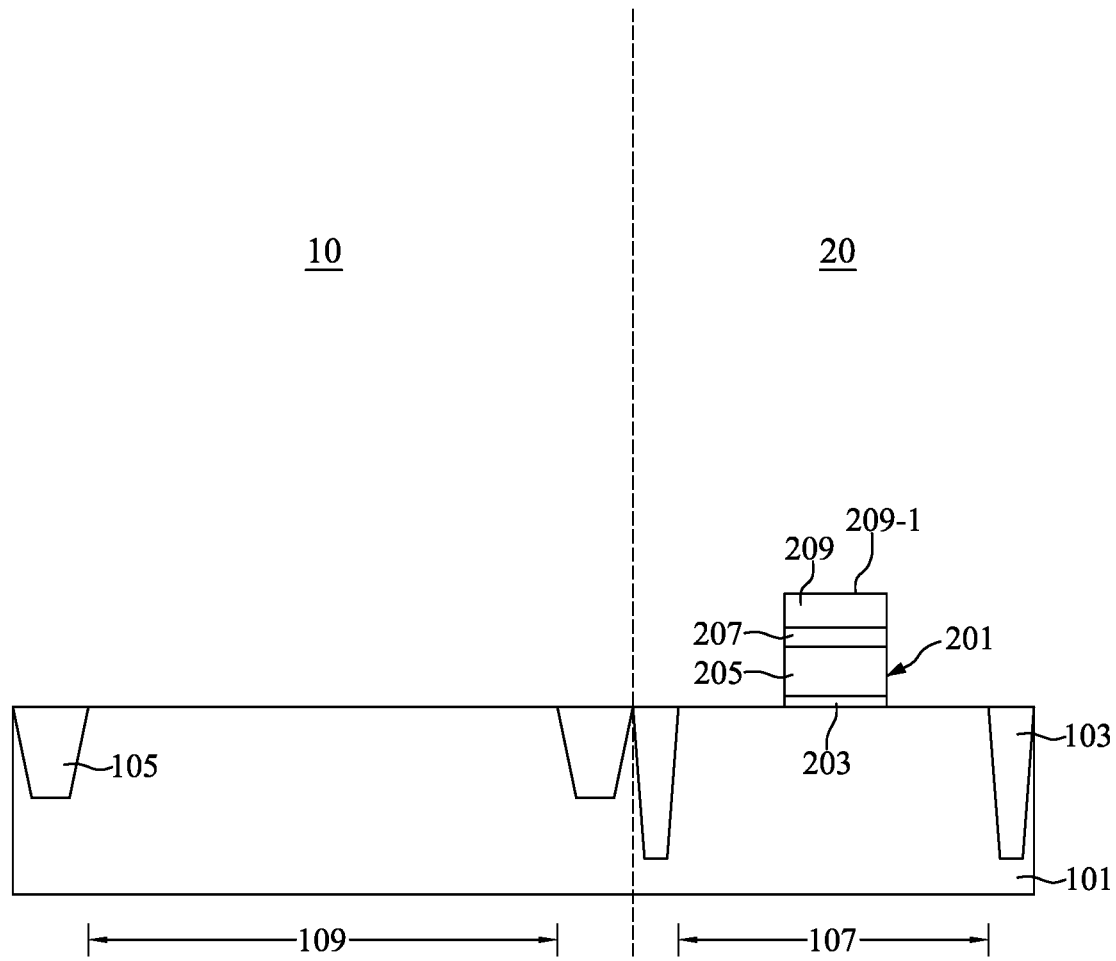

With reference to FIG. 14, after the photolithography process, an etch process, such as an anisotropic dry etch process, may be performed to remove portions of the gate mask layer 507, the gate second conductive layer 505, the gate first conductive layer 503 and the gate insulating layer 501, and turn the remaining portions of the aforementioned layers into a gate insulating film 203, a gate first conductive film 205, a gate second conductive film 207, and a gate mask film 209, respectively. The gate insulating film 203, the gate first conductive film 205, the gate second conductive film 207, and the gate mask film 209 together form the gate structure 201.

Figure 15:
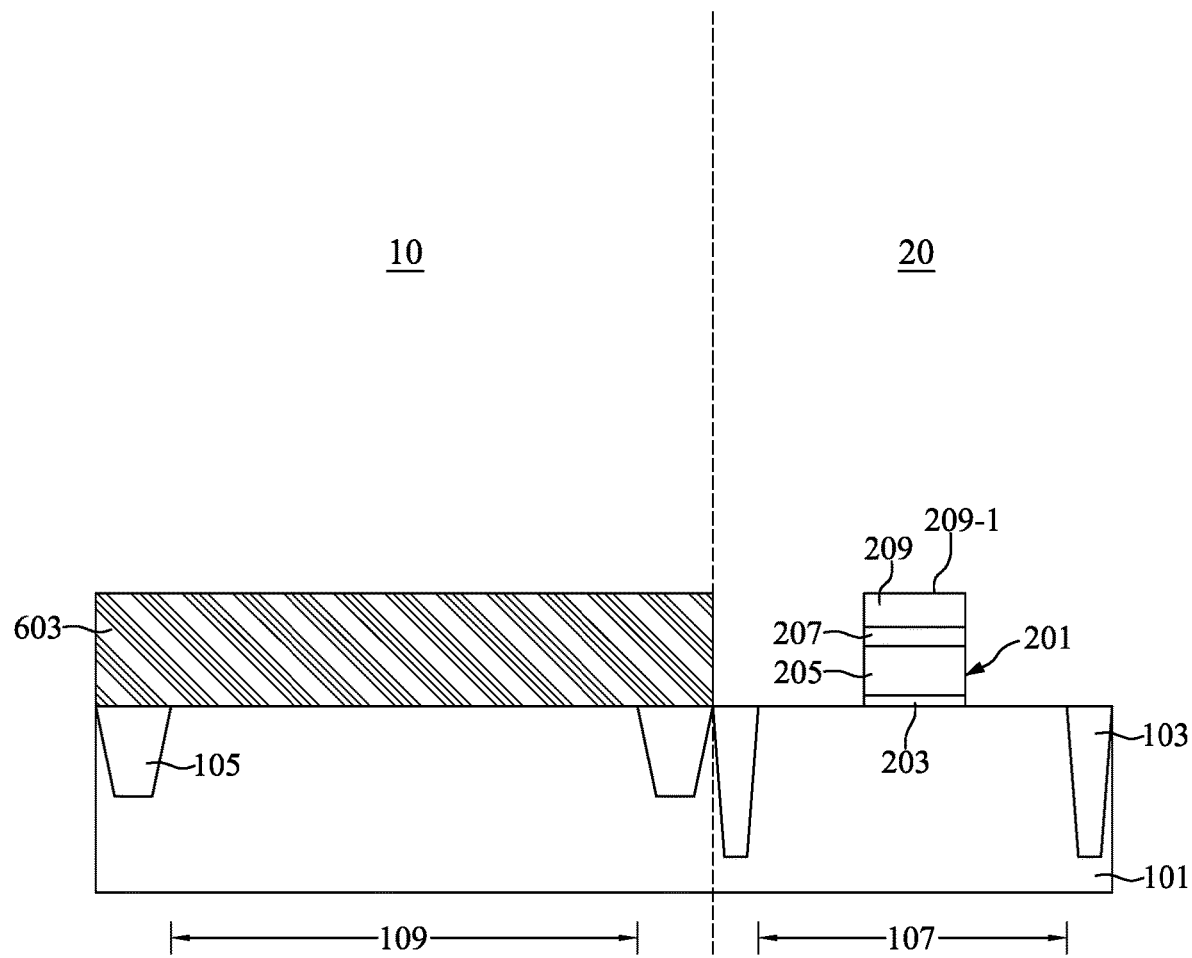
Figure 16:
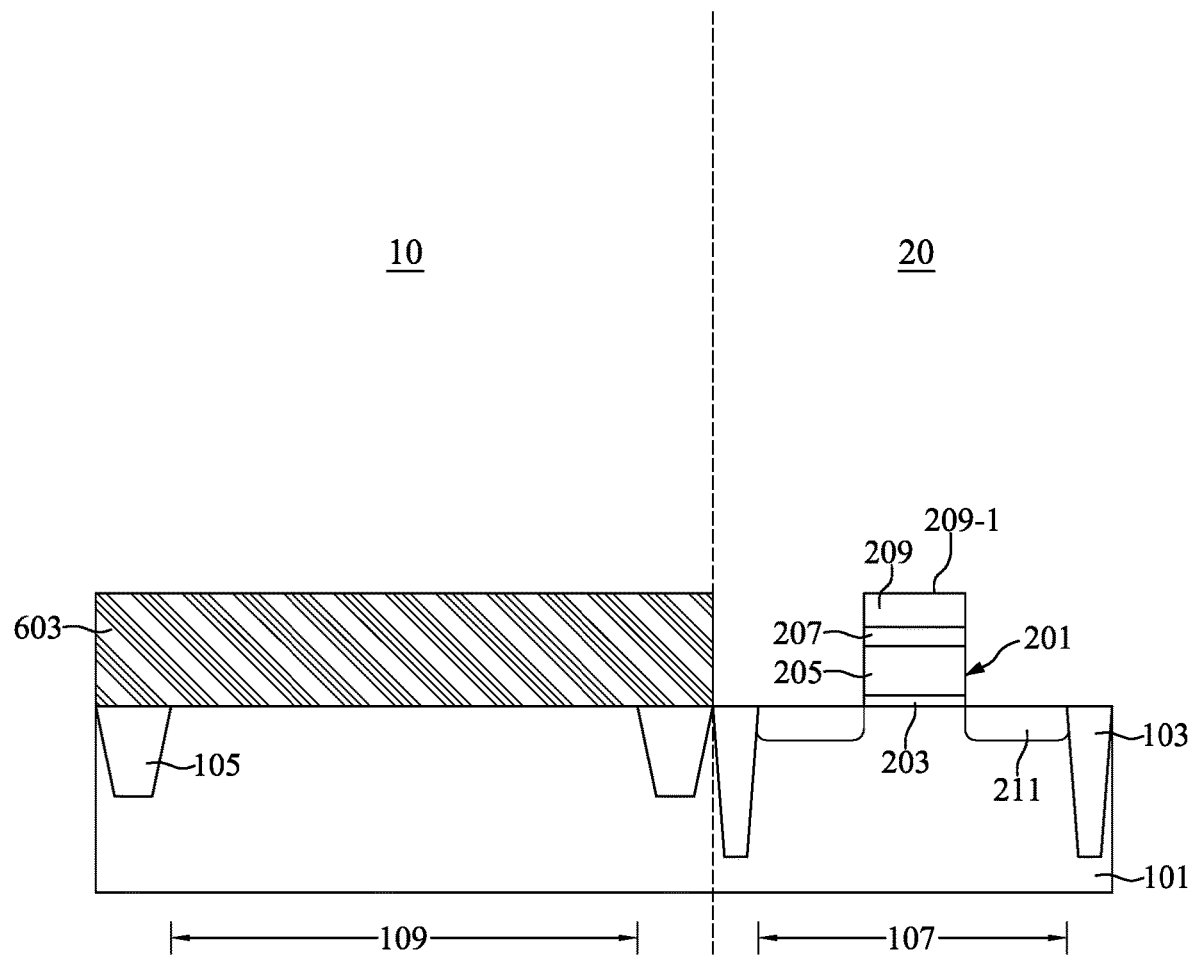

With reference to FIGS. 9 and 15 to 19, at step S15, in the embodiment depicted, a pair of lightly-doped regions 211 and a pair of heavily-doped regions 213 may be formed in the substrate 101, and a pair of first spacers 215 may be formed on the substrate 101. With reference to FIG. 15, a second mask segment 603 may be formed to mask the array area 10 of the substrate 101. With reference to FIG. 16, an implantation process may be performed to form the pair of lightly-doped regions 211 in the substrate 101 and adjacent to the gate insulating film 203. After the implantation process, the second mask segment 603 may be removed.

Figure 17:
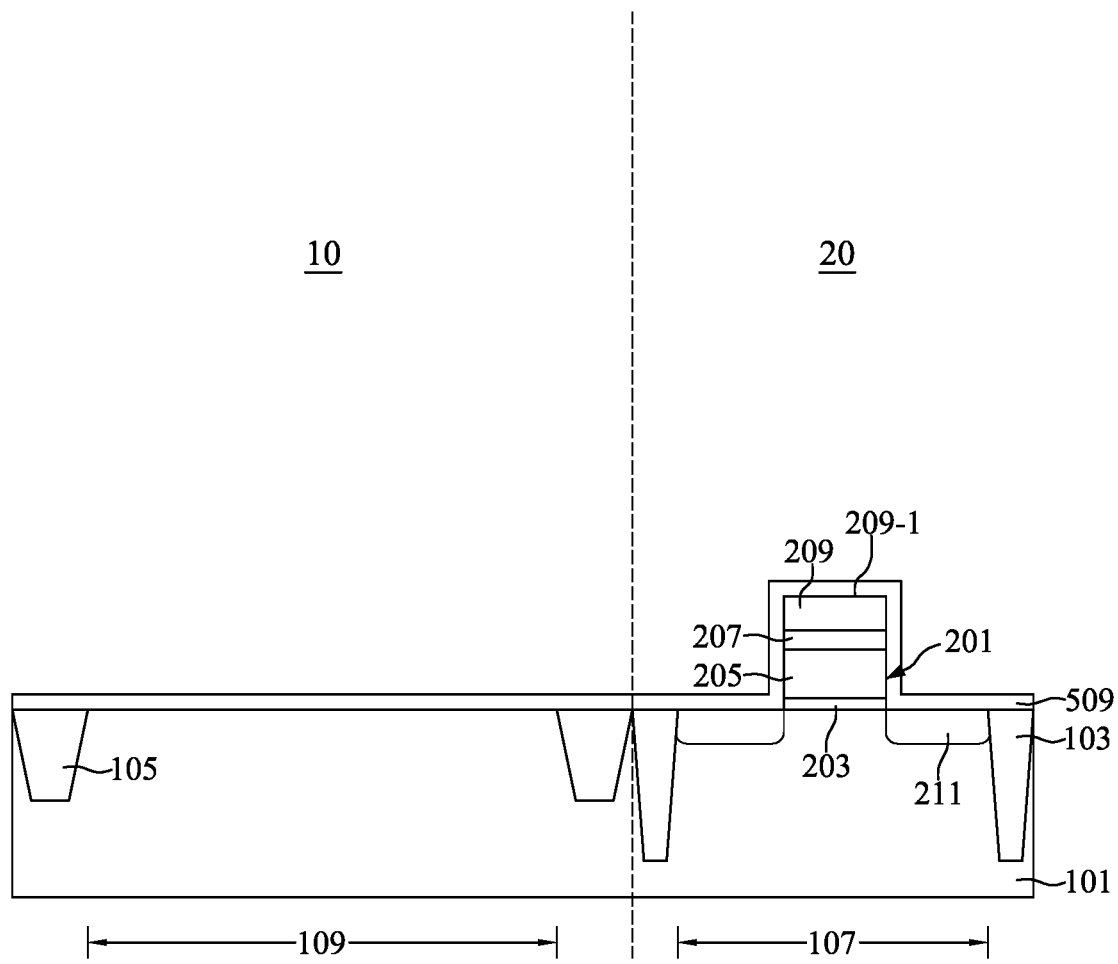
Figure 18:
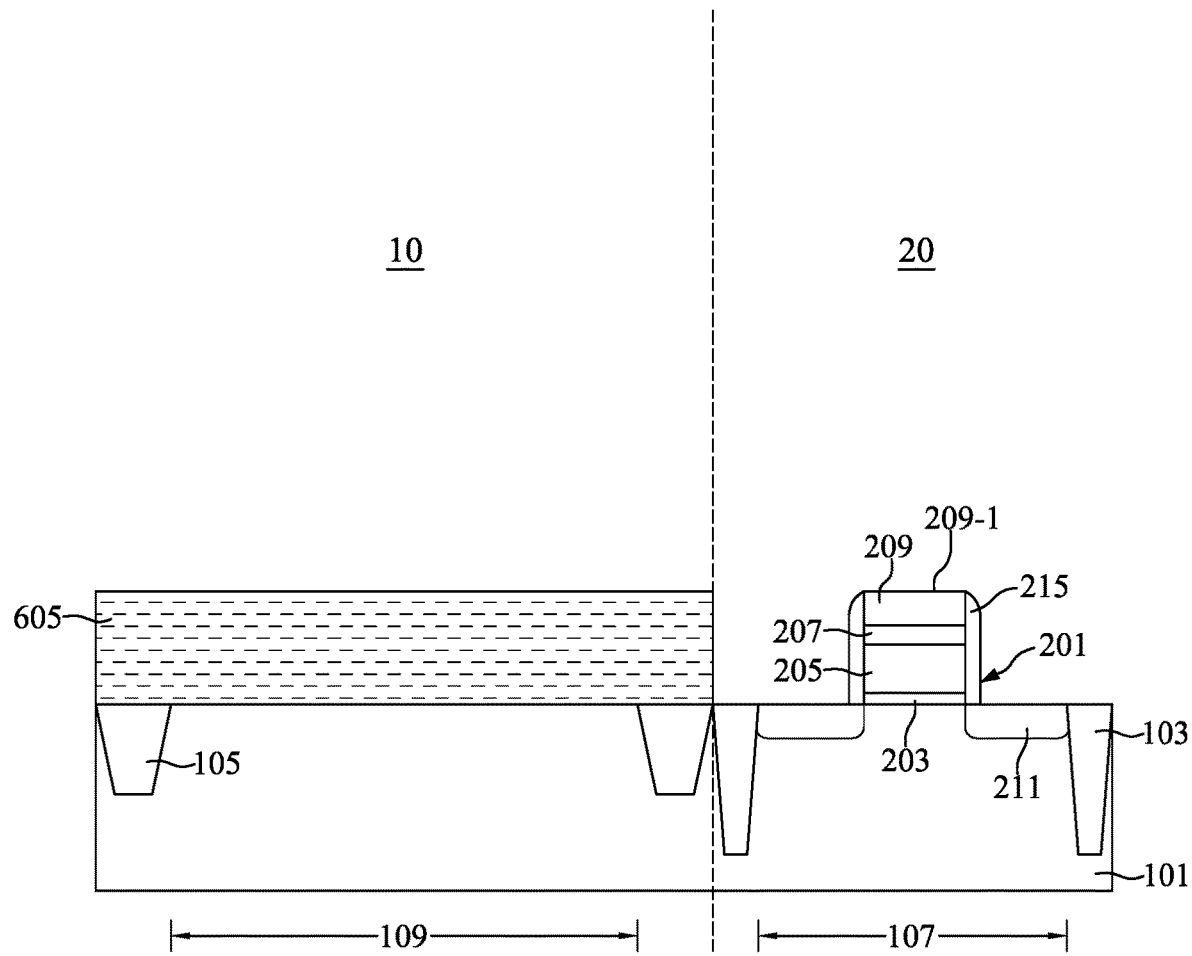
Figure 19:
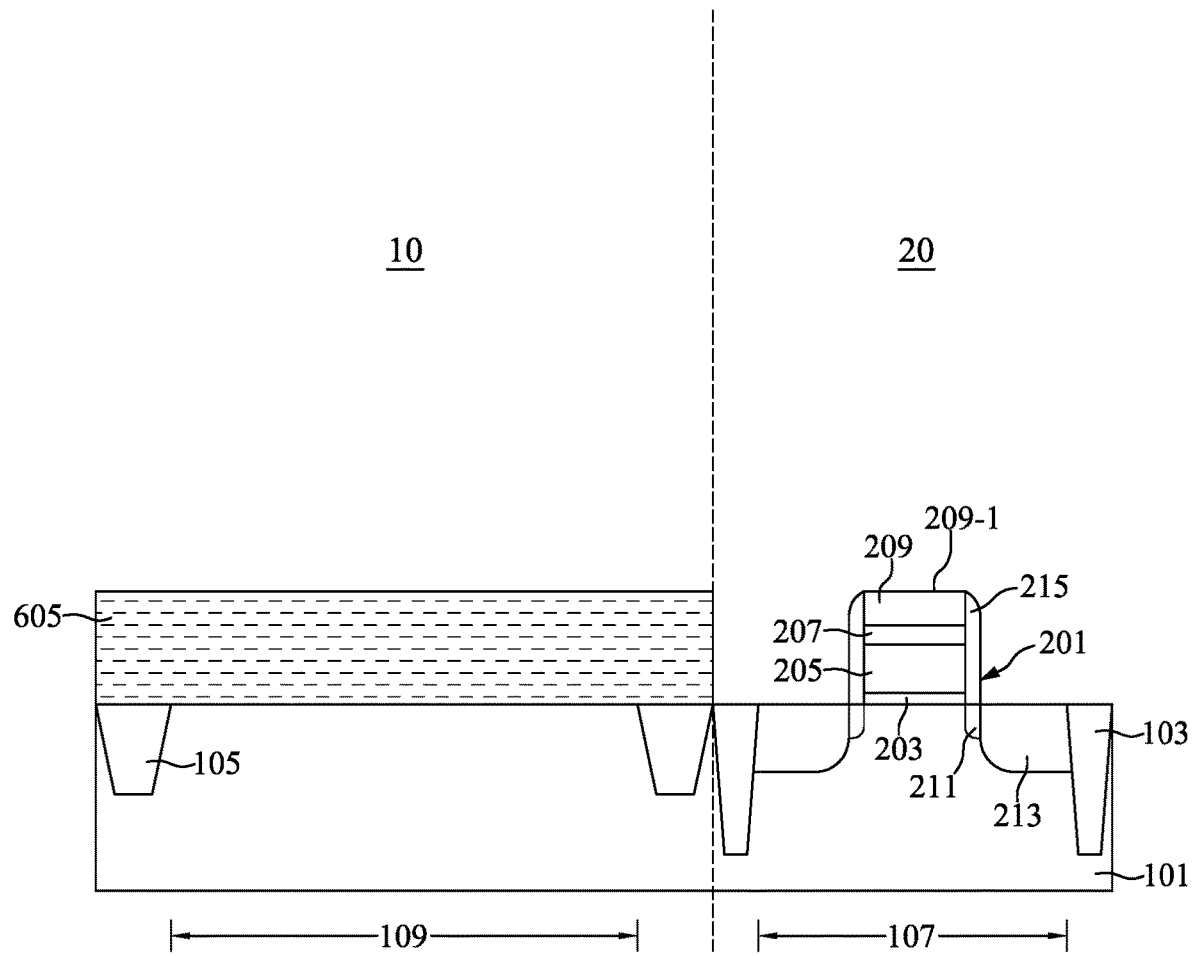

With reference to FIG. 17, a spacer layer 509 may be formed by a deposition process and may cover the top surface of the substrate 101 and the gate structure 201. The spacer layer 509 may be formed of, for example, polysilicon, silicon oxide, or silicon nitride. With reference to FIG. 18, an etch process, such as an anisotropic dry etch process, may be performed to remove portions of the spacer layer 509 formed on the top surface of the substrate 101 and a top surface 209-1 of the gate mask film 209, and may turn the remaining spacer layer 509 into a pair of first spacers 215 attached to two sides of the gate structure 201. After the etch process, a third mask segment 605 may be formed to cover the array area 10 of the substrate 101. With reference to FIG. 19, an implantation process may be performed to form the pair of heavily-doped regions 213 in the substrate 101 and adjacent to the pair of first spacers 215. After the implantation process, the third mask segment 605 may be removed.

Figure 20:
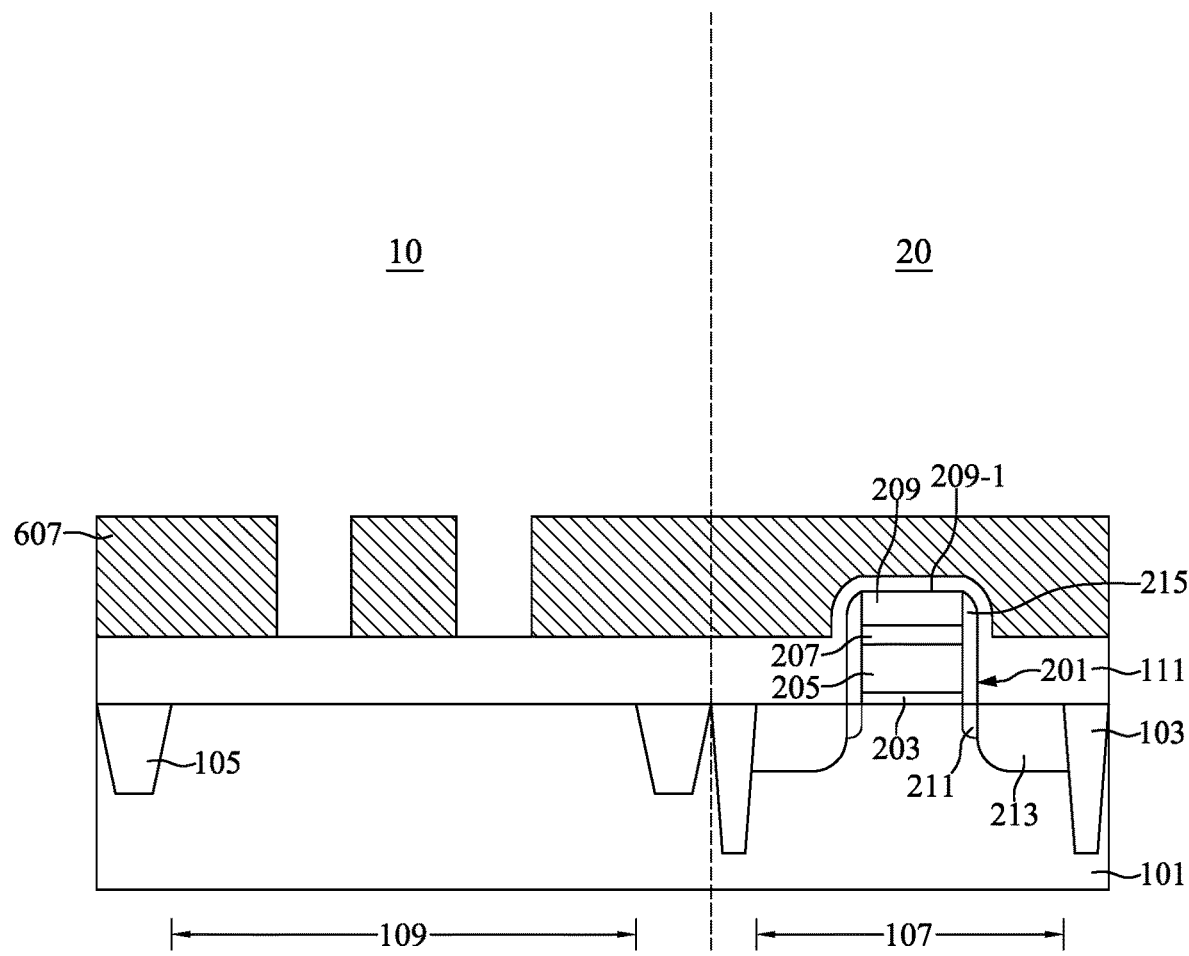
Figure 21:
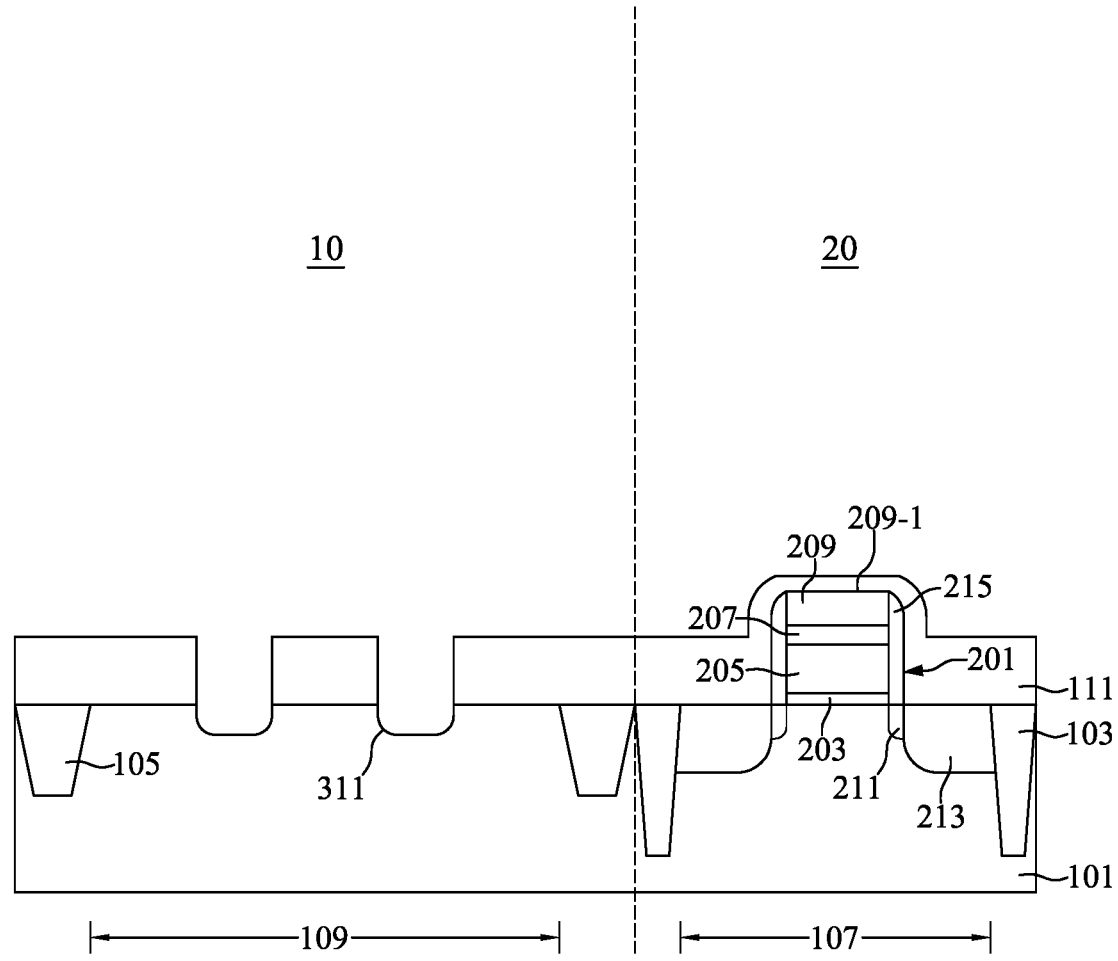

With reference to FIGS. 9, 20, and 21, at step S17, in the embodiment depicted, a first insulating layer 111 may be formed on the substrate 101 and a plurality of word line trenches 311 may be formed so as to penetrate through the first insulating layer 111 and into the substrate 101. With reference to FIG. 20, a first insulating layer 111 may be formed over the substrate 101 by a deposition process. A portion of the first insulating layer 111 deposited on the gate structure 201 and the pair of first spacers 215 may protrude from a top surface of a remaining portion of the first insulating layer 111. A photolithography process using fourth mask segments 607 as masks may be performed to define positions of the plurality of word line trenches 311. With reference to FIG. 21, after the photolithography process, an etch process, such as an anisotropic dry etch process, may be performed to form the plurality of word line trenches 311 so as to penetrate through the first insulating layer 111 and into the substrate 101. The plurality of word line trenches 311 may be located at the array area 10. Bottoms of the plurality of word line trenches 311 may be flat.

Figure 22:
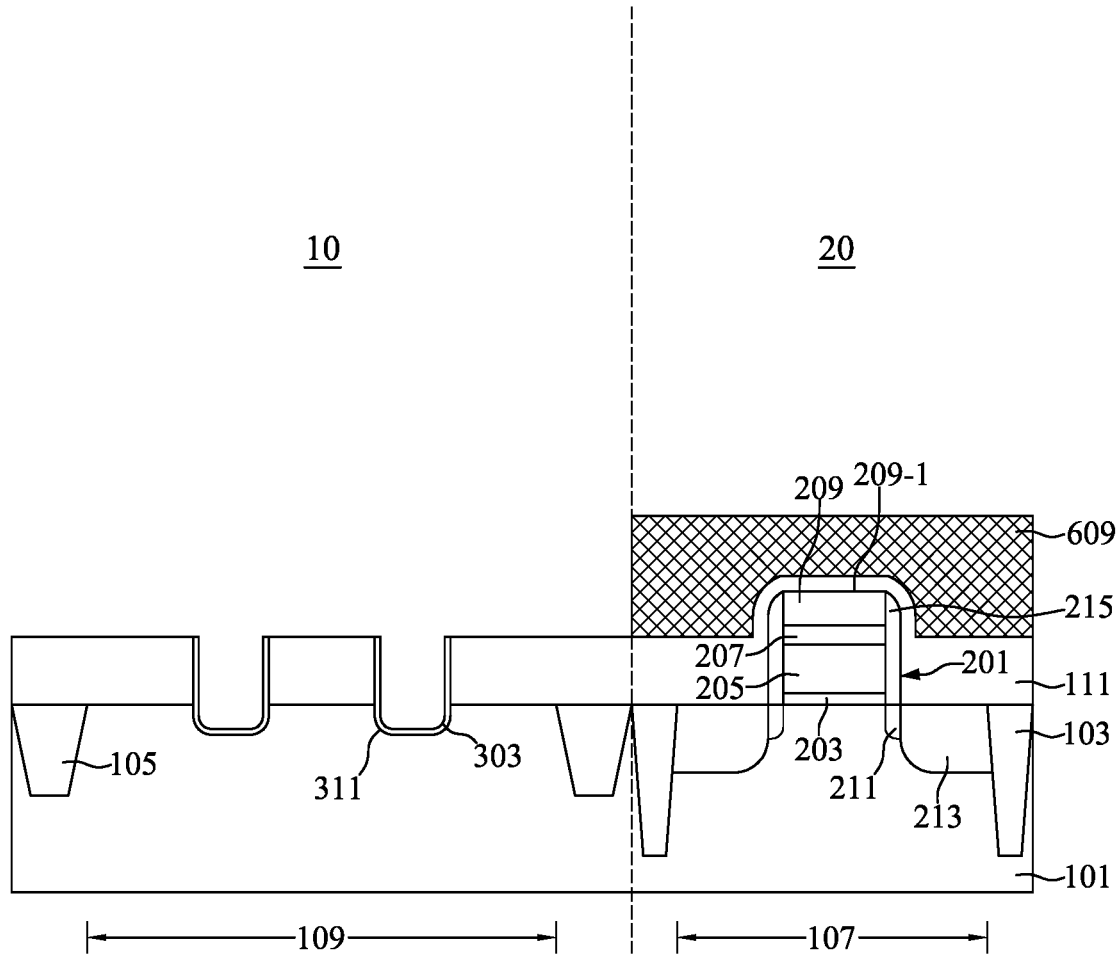

With reference to FIGS. 9 and 22 to 24, at step S19, in the embodiment depicted, a plurality of word line channel films 303, a plurality of word line insulating films 305, and a plurality of word line electrodes 307 may be respectively correspondingly formed in the plurality of word line trenches 311. With reference to FIG. 22, a fifth mask segment 609 may be formed to cover the peripheral area 20 of the substrate 101. The plurality of word line channel films 303 may be formed in the plurality of word line trenches 311. Top surfaces of the plurality of word line channel films 303 may be even with the top surface of the first insulating layer 111 at the array area 10.

Figure 23:
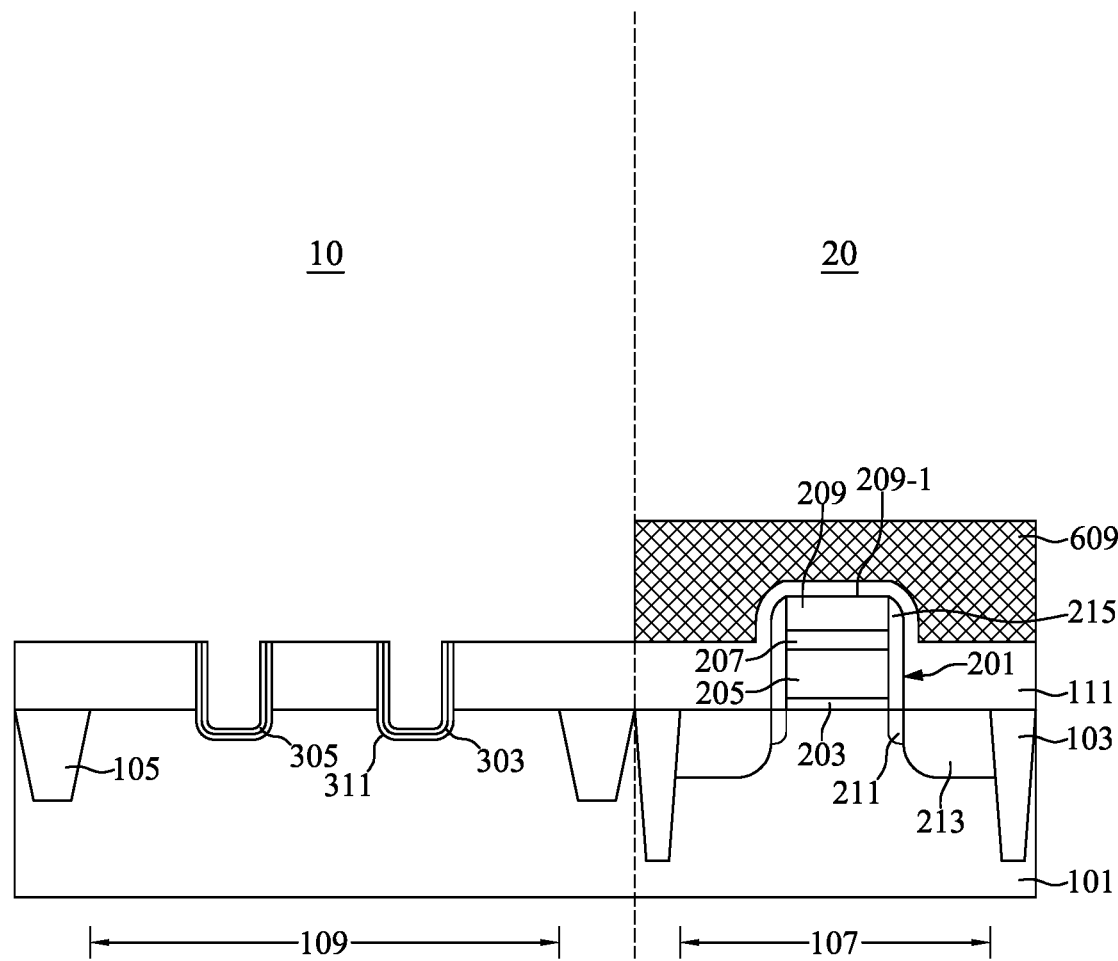
Figure 24:
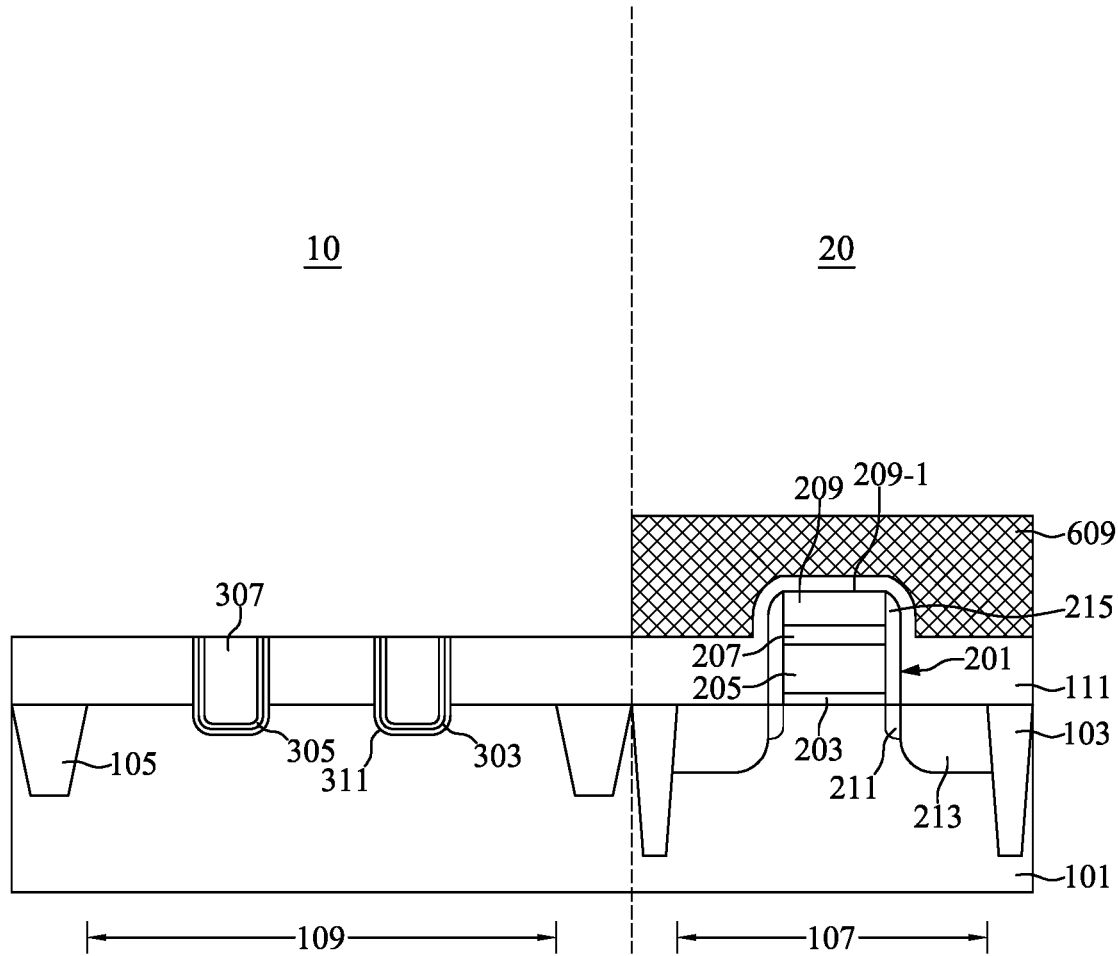

With reference to FIG. 23, the plurality of word line insulating films 305 may be respectively correspondingly formed on the plurality of word line channel films 303 in the plurality of word line trenches 311. Top surfaces of the plurality of word line insulating films 305 may be even with the top surfaces of the plurality of word line channel films 303 and the top surface of the first insulating layer 111 at the array area 10. With reference to FIG. 24, the plurality of word line electrodes 307 may be respectively correspondingly formed on the plurality of word line insulating films 305 and may fill the plurality of word line trenches 311. Top surfaces of the plurality of word line electrodes 307 may be even with the top surfaces of the plurality of word line insulating films 305, top surfaces of the plurality of word line channel films 303, and the top surface of the first insulating layer 111 at the array area 10.

Figure 25:
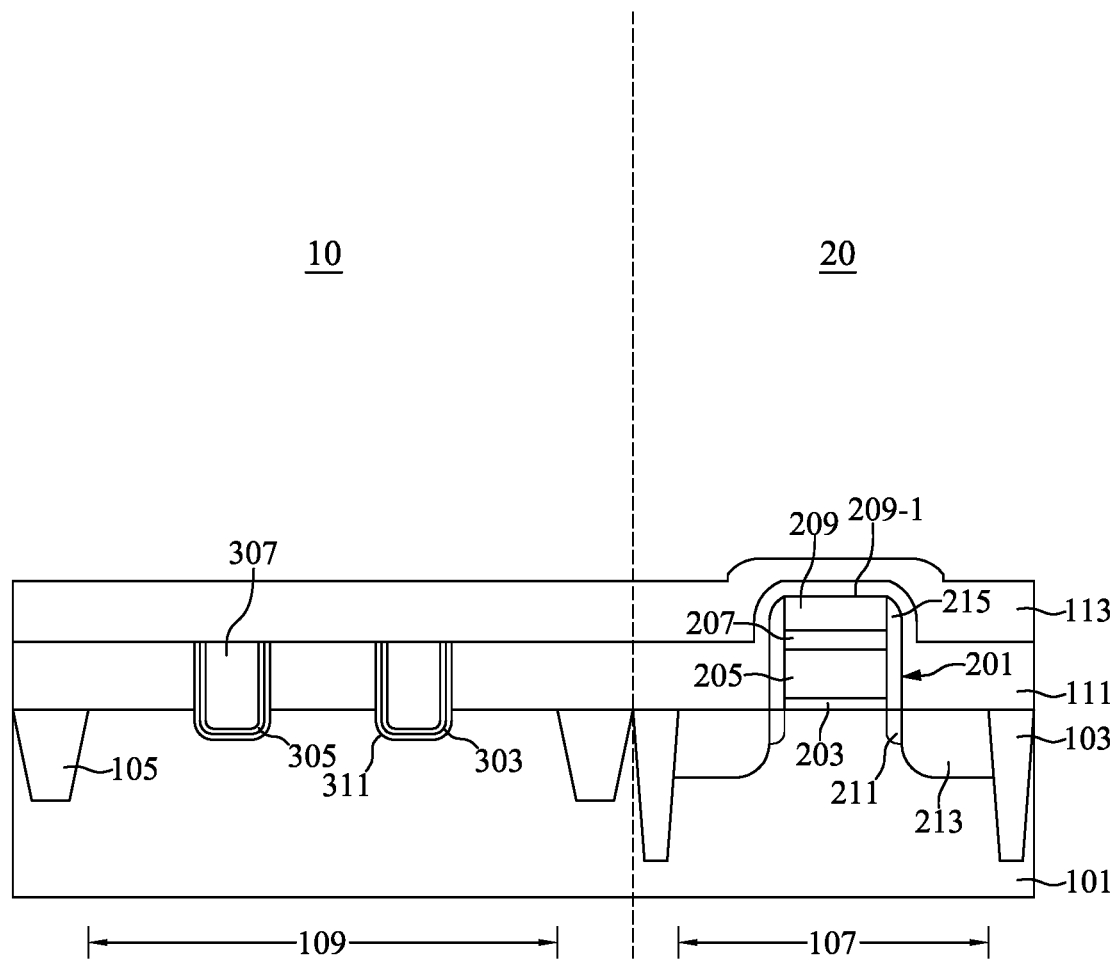

With reference to FIGS. 9 and 25, at step S21, in the embodiment depicted, a second insulating layer 113 may be formed on the first insulating layer 111 by a deposition process. The portion of the second insulating layer 113 deposited above the gate structure 201 and the pair of first spacers 215 may protrude from a top surface of the remaining portion of the second insulating layer 113.

Figure 26:
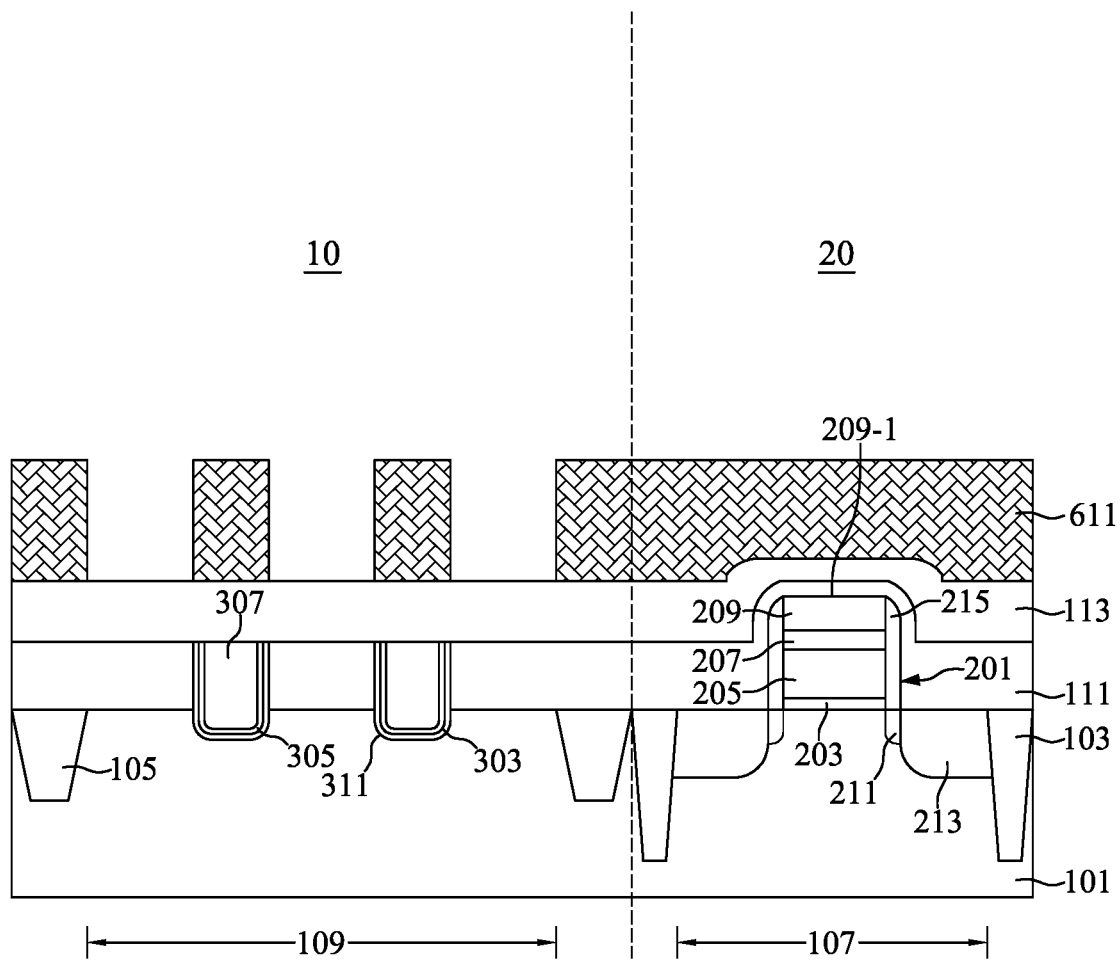
Figure 27:
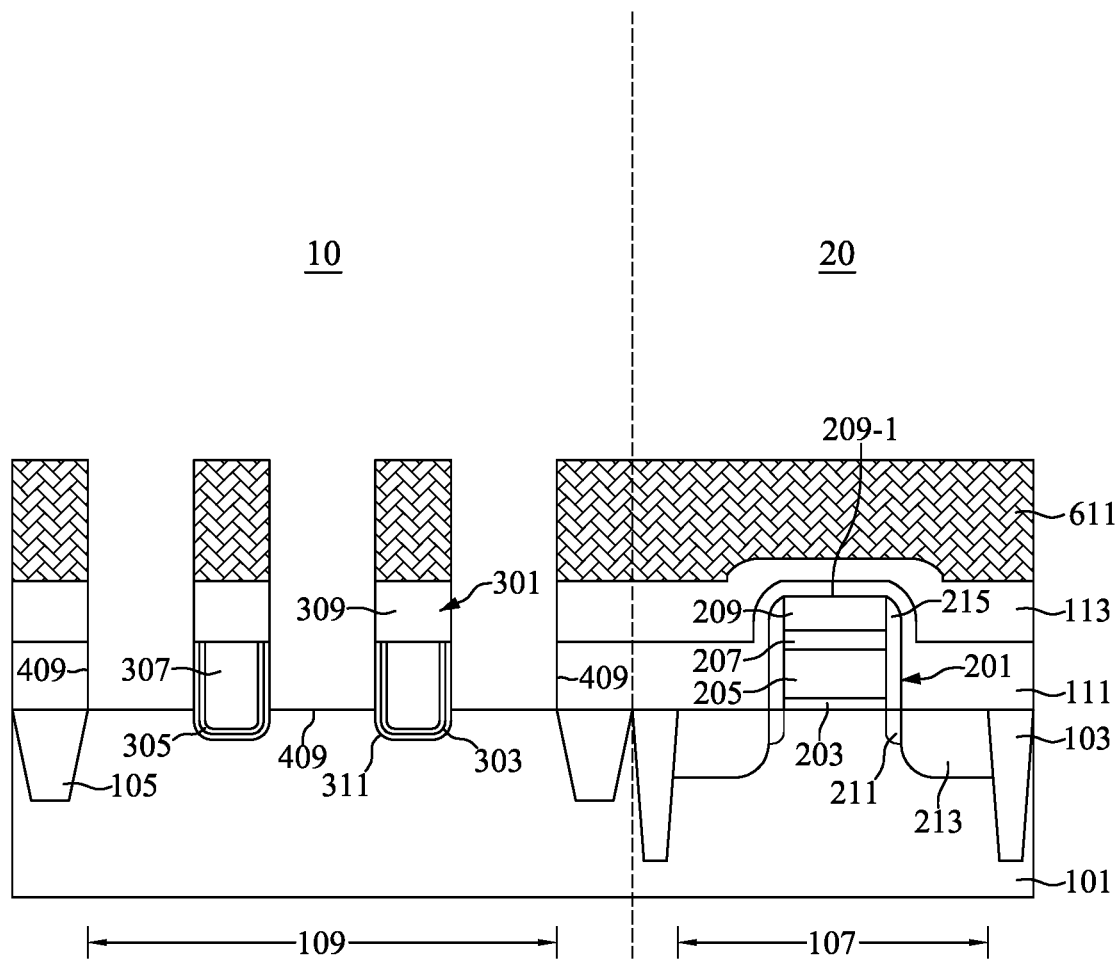

With reference to FIGS. 9, 26, and 27, at step S23, in the embodiment depicted, a plurality of word line capping films 309 may be formed above the substrate 101, wherein the plurality of word line capping films 309, the plurality of word line electrodes 307, the plurality of word line insulating films 305, and the plurality of word line channel films 303 together form a plurality of word lines 301, and a plurality of conductive region openings 409 may be formed so as to penetrate through the second insulating layer 113 and the first insulating layer 111. With reference to FIG. 26, a photolithography process using sixth mask segments 611 as masks may be performed to define positions of the plurality of conductive region openings 409.

With reference to FIG. 27, after the photolithography process, an etch process, such as an anisotropic dry etch process, may be performed to remove portions of the second insulating layer 113 and the first insulating layer 111 located at the array area 10 to concurrently form the plurality of word line capping films 309 and the plurality of conductive region openings 409. The plurality of word line capping films 309 may be respectively correspondingly formed on the top surfaces of the plurality of word line electrodes 307, the plurality of word line insulating films 305, and the plurality of word line channel films 303. The plurality of word line capping films 309, the plurality of word line electrodes 307, the plurality of word line insulating films 305, and the plurality of word line channel films 303 together form the plurality of word lines 301. The plurality of conductive region openings 409 may be respectively correspondingly formed adjacent to the plurality of word lines 301. Portions of the top surfaces of the substrate 101 may be exposed through the plurality of conductive region openings 409.

Figure 28:
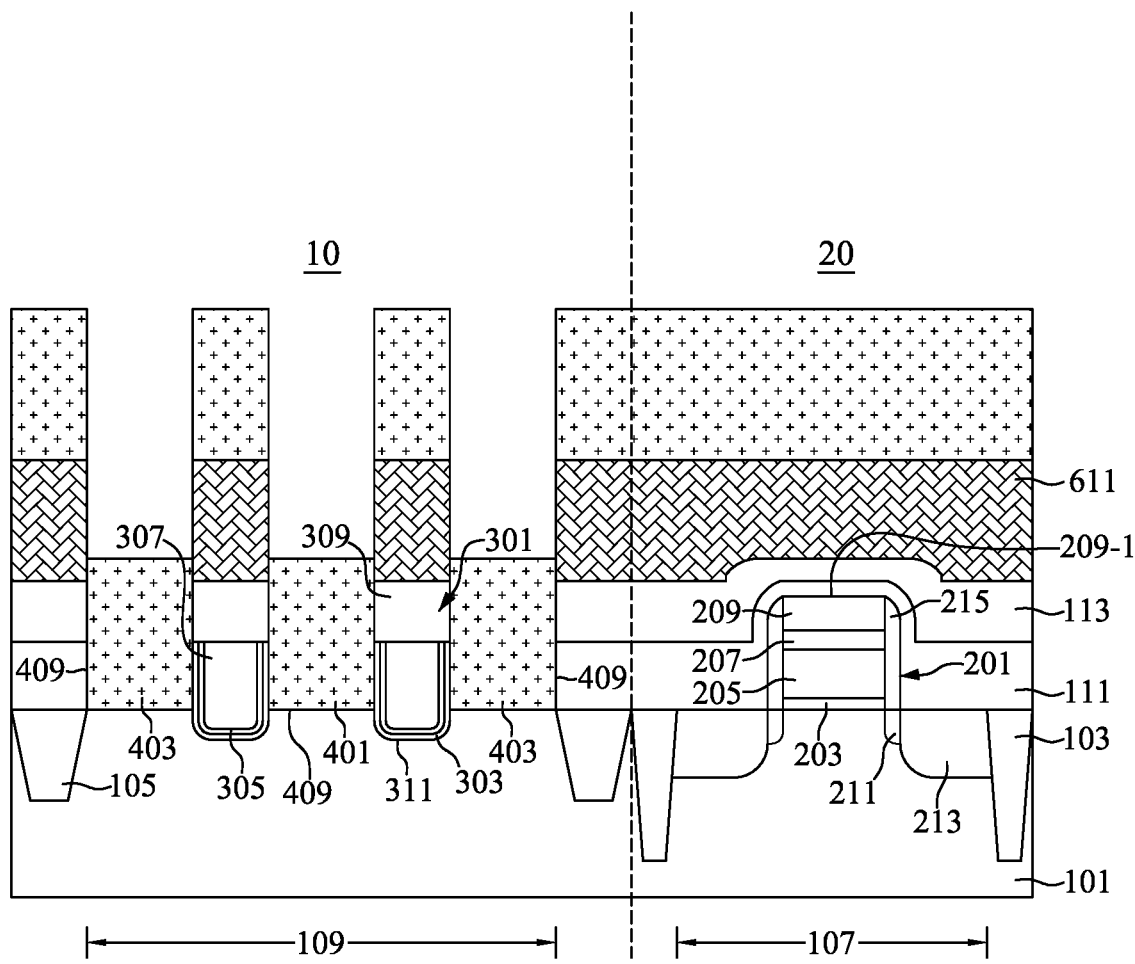

With reference to FIGS. 9 and 28 to 30, at step S25, in the embodiment depicted, a plurality of conductive regions may be respectively correspondingly formed in the plurality of conductive region openings 409. With reference to FIG. 28, a polysilicon layer may be deposited over the substrate 101 to fill the plurality of conductive region openings 409 and concurrently form the plurality of conductive regions. The plurality of conductive regions may include a first conductive region 401 and two second conductive regions 403. The first conductive region 401 may be formed between an adjacent pair of the plurality of word lines 301. The two second conductive regions 403 may be formed opposite to the first conductive region 401 and adjacent to the plurality of word lines 301.

Figure 29:
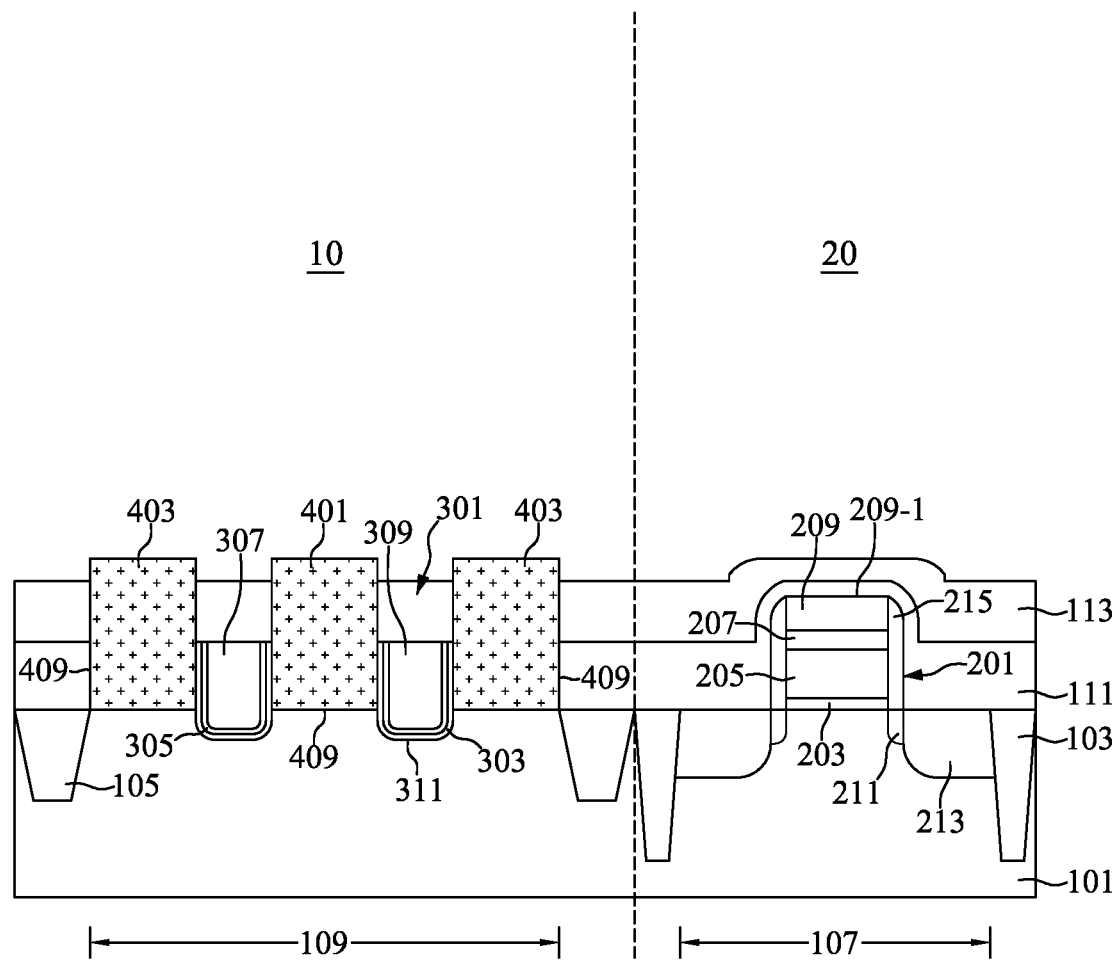
Figure 30:
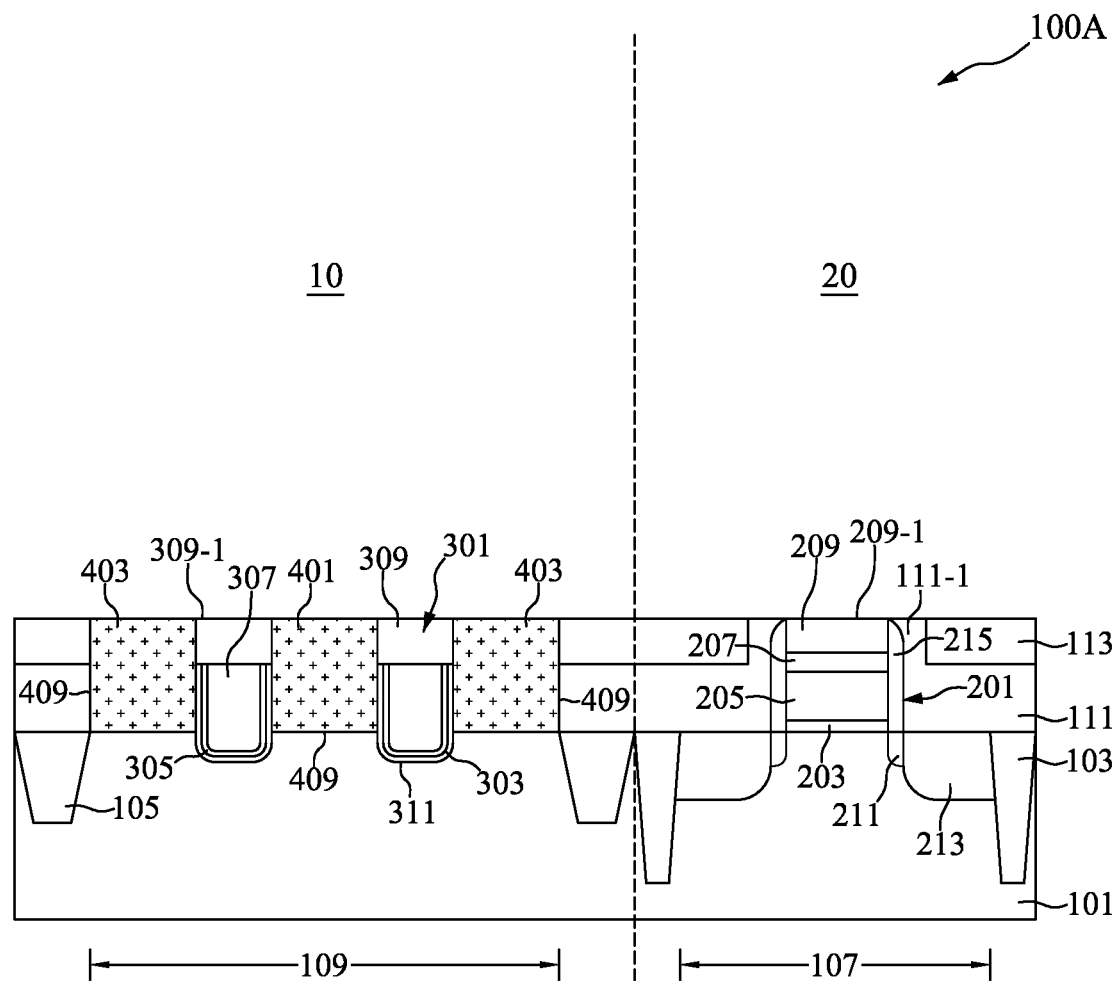

With reference to FIG. 29, the sixth mask segments 611 may be removed. Portions of the polysilicon layer formed on the sixth mask segments 611 may be removed along with the sixth mask segments 611. It should be noted that, at the current stage, top surfaces of the first conductive region 401 and the two second conductive regions 403 may be higher than the top surface of the second insulating layer 113 or the top surfaces of the plurality of word line capping films 309. With reference to FIG. 30, a planarization process, such as chemical mechanical polishing, may be performed until the top surface 209-1 of the gate mask film 209 is exposed, in order to provide a substantially flat surface for subsequent processing steps. Protruding first insulating segments 111-1 may be concurrently formed.

Due to the design of the semiconductor device of the present disclosure, the top surface of the second insulating layer 113, the top surface of the gate structure 201, the top surfaces of the plurality of word lines 301, and the top surfaces of the plurality of conductive regions may be even. In other words, top surfaces of the array area 10 and the peripheral area 20 may be even and the semiconductor device may have a substantially flat top surface, to facilitate performing of subsequent semiconductor processes on the substantially flat top surface. Therefore, the yield and quality of the semiconductor device may be improved. In addition, the pair of gate stress regions 223, the first stress region 405, and the two second stress regions 407 may increase the carrier mobility of the semiconductor device; therefore, the performance of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method for fabricating a semiconductor device, comprising:
provided a substrate which has an array area and a peripheral area;
forming a gate structure over a top surface of the substrate in the peripheral area;
forming a first insulating layer on the substrate;
forming a second insulating layer on the first insulating layer, wherein the gate structure is positioned in the first insulating layer, and a top surface of the gate structure is even with a top surface of the second insulating layer; and
forming a plurality of word lines apart from the gate structure in the array area, the word lines having top surfaces at a same vertical level as the top surface of the gate structure, which comprises:
inwardly forming a plurality of word line channel films in the first insulating layer and the substrate, wherein lower portions of the plurality of word line channel films are extended to penetrate an upper portion of the substrate and upper portions of the plurality of word line channel films are positioned within the first insulating layer and above the top surface of the substrate, wherein top surfaces of the word line channel films are even with a top surface of the first insulating layer.

2. The method for fabricating the semiconductor device of claim 1, wherein each of the word line channel films has a U-shaped cross-sectional; profile, wherein the gate structure comprises a gate insulating film, a gate first conductive film, a gate second conductive film, and a gate mask film, and forming the gate structure on the substrate comprises:
sequentially forming a gate insulating layer, a gate first conductive layer, a gate second conductive layer, and a gate mask layer on the substrate;
patterning the gate mask layer with first mask segments;
performing an etch process to remove portions of the gate insulating layer, the gate first conductive layer, the gate second conductive layer, and the gate mask layer; and
concurrently forming the gate insulating film on the substrate, the gate first conductive film on the gate insulating film, the gate second conductive film on the gate first conductive film, and the gate mask film on the gate second conductive film, wherein a top surface of the gate mask film is even with the top surface of the second insulating layer.

3. The method for fabricating the semiconductor device of claim 2, further comprising:
forming a pair of lightly-doped regions adjacent to the gate insulating film and in the substrate;
forming a pair of first spacers attached to two sides of the gate structure; and forming a pair of heavily-doped regions adjacent to the pair of first spacers and in the substrate.

4. The method for fabricating the semiconductor device of claim 2, wherein the gate structure is formed in the first insulating layer.

5. The method for fabricating the semiconductor device of claim 4, wherein forming the plurality of word lines having the top surfaces at the same vertical level as the top surface of the gate structure further comprises:

forming a plurality of word line trenches penetrating through the first insulating layer and into the substrate;

forming the plurality of word line channel films in the plurality of word line trenches;

forming a plurality of word line insulating films on the plurality of word line channel films and in the first insulating layer to cover inner surfaces of the word line channel films, wherein each of the word line insulating films has a U-shaped cross-sectional profile, wherein top surfaces of the word line insulating films are even with the top surfaces of the word line channel films and the top surface of the first insulating layer;

forming a plurality of word line electrodes on the plurality of word line insulating films;

performing an etching process to remove portions of the second insulating layer and concurrently form a plurality of word line capping films on the plurality of word line electrodes; and performing a planarization process to make the top surfaces of the plurality of word lines and the top surface of the gate structure at the same vertical level.

\* \* \* \* \*